(12) United States Patent
Li et al.

(10) Patent No.: US 11,695,386 B2
(45) Date of Patent: Jul. 4, 2023

(54) SOLIDLY MOUNTED RESONATOR HAVING ELECTROMAGNETIC SHIELDING STRUCTURE, AND MANUFACTURING PROCESS

(71) Applicant: JWL (ZHEJIANG) SEMICONDUCTOR CO., LTD, Zhejiang (CN)

(72) Inventors: Linping Li, Zhejiang (CN); Jinghao Sheng, Zhejiang (CN); Zhou Jiang, Zhejiang (CN)

(73) Assignee: JWL (ZHEJIANG) SEMICONDUCTOR CO., LTD

( * ) Notice: Subject to any disclaimer, the term of this patent is extended or adjusted under 35 U.S.C. 154(b) by 0 days.

(21) Appl. No.: 17/800,138

(22) PCT Filed: Aug. 12, 2020

(86) PCT No.: PCT/CN2020/108711
§ 371 (c)(1),
(2) Date: Aug. 16, 2022

(87) PCT Pub. No.: WO2021/164215
PCT Pub. Date: Aug. 26, 2021

(65) Prior Publication Data
US 2023/0063980 A1    Mar. 2, 2023

(30) Foreign Application Priority Data
Feb. 19, 2020 (CN) .......................... 202010103144.5

(51) Int. Cl.
*H03H 9/02* (2006.01)
*H03H 9/17* (2006.01)
*H03H 9/05* (2006.01)

(52) U.S. Cl.
CPC ...... *H03H 9/0211* (2013.01); *H03H 9/02015* (2013.01); *H03H 9/0504* (2013.01); *H03H 9/175* (2013.01)

(58) Field of Classification Search
CPC ............ H03H 9/02; H03H 9/17; H10N 30/05; H10N 30/80
See application file for complete search history.

(56) References Cited

U.S. PATENT DOCUMENTS 9,083,302 B2 *  7/2015  Burak .................... H03H 9/132
9,577,603 B2 *  2/2017  Burak .................... H03H 9/132
(Continued)

FOREIGN PATENT DOCUMENTS

CN         1246929 C      3/2006
CN         03579201 A     2/2014
(Continued)

*Primary Examiner* — Hafizur Rahman
*Assistant Examiner* — Alan Wong
(74) *Attorney, Agent, or Firm* — The Belles Group, P.C.

(57) ABSTRACT

A solidly mounted resonator having an electromagnetic shielding structure and a method for manufacturing the same. The solidly mounted resonator includes: a substrate; an acoustic-wave reflecting layer formed on the substrate; a resonance function layer formed on the acoustic-wave reflecting layer; and a metal shielding wall formed on the substrate, wherein the metal shielding wall surrounds an effective region in the acoustic-wave reflecting layer and the resonance function layer. The electromagnetic shielding structure is formed simultaneously with the resonator, and it is not necessary to provide an additional electromagnetic shielding device. An influence of an external or internal electromagnetic interference source on the resonator is avoided while ensuring a small dimension and a high performance of the resonator.

20 Claims, 17 Drawing Sheets

(56) References Cited

U.S. PATENT DOCUMENTS

| | | | |
|---|---|---|---|
| 9,653,516 B2 * | 5/2017 | Tsai | H03H 9/173 |
| 9,735,338 B2 * | 8/2017 | Guillou | H03H 9/1007 |
| 10,361,676 B2 | 7/2019 | Yusuf | |
| 10,404,230 B2 * | 9/2019 | Kaneko | H03H 9/173 |
| 10,630,259 B2 * | 4/2020 | Hurwitz | H03H 9/588 |
| 11,249,049 B2 * | 2/2022 | Cole | G01N 15/0656 |
| 2003/0147197 A1 | 8/2003 | Uriu et al. | |
| 2019/0103851 A1 | 4/2019 | Yusuf | |

FOREIGN PATENT DOCUMENTS

| | | |
|---|---|---|
| CN | 105703733 A | 6/2016 |
| CN | 110224680 A | 9/2019 |
| CN | 111342792 A | 6/2020 |
| JP | 2007067778 A | 3/2007 |
| KR | 20190038435 A | 4/2019 |

\* cited by examiner

SOLIDLY MOUNTED RESONATOR HAVING ELECTROMAGNETIC SHIELDING STRUCTURE, AND MANUFACTURING PROCESS

CROSS-REFERENCE TO RELATED PATENT APPLICATIONS

This application is the national phase of International Application No. PCT/CN2020/108711, titled "SOLIDLY MOUNTED RESONATOR HAVING ELECTROMAGNETIC SHIELDING STRUCTURE, AND MANUFACTURING PROCESS", filed on Aug. 12, 2020, which claims the priority to Chinese Patent Application No. 202010103144.5, titled "SOLIDLY MOUNTED RESONATOR HAVING ELECTROMAGNETIC SHIELDING STRUCTURE AND METHOD FOR MANUFACTURING THE SAME", filed on Feb. 19, 2020 with the China National Intellectual Property Administration, which is incorporated herein by reference in their entireties.

FIELD

The present disclosure relates to the field of communication devices, and in particular to a solidly mounted resonator having an electromagnetic shielding structure, and a method for manufacturing the solidly mounted resonator.

BACKGROUND

The electromagnetic spectrum becomes increasingly crowded, and wireless communication devices are provided with more and more frequency bands and functions. Consequently, the electromagnetic spectrum for wireless communications is expanding rapidly from 500 MHz to more than 5 GHz, and there is an increasing demand for radio-frequency (RF) front-end modules having a high performance, low costs, low power consumption, and a small dimension. The increasingly crowded external electromagnetic environment has a strong impact on normal operation of the devices. A tiny space and highly integrated modules within the RF front-end products is apt to cause inter-device electromagnetic interferences. In order to ensure normal and effective operation of the RF products, it is necessary to provide shielding against interferences of external and internal electromagnetic (EM) sources.

As a kind of the RF front-end module, filters are capable to improve quality of transmitted signals and received signals. Generally, the filter comprises multiple resonators that are connected via a topological network structure. BAW refers to a bulk acoustic wave resonator. The filters comprising the BAW have advantages of a small dimension, a high degree of integration, a high quality factor Q under high frequency, and a strong power tolerance, and hence the BAW is a core device at the RF front end.

The SMR (solidly mounted resonator) is a type of the BAW devices. In conventional technology, the SMR devices have no electromagnetic shielding layer, and hence require additional electromagnetic shielding devices during usage, which increases a dimension and reduce a performance of the filters. In addition, an upper electrode, a piezoelectric layer, and a lower electrode of the conventional SMR devices do not have a good C-axis preferred orientation, which reduces a performance and a quality factor of the SMR devices.

An objective of the present disclosure is to provide a novel SMR structure and a novel method for manufacturing SMRs, so that the devices is characterized in not only good BAW performances but also good shielding against external and internal EM interferences.

SUMMARY

As discussed in the background, conventional solidly mounted resonators (SMRs) do not have an electromagnetic shielding function, and the upper electrode layer, the piezoelectric layer, and the lower electrode layer thereof do not have a good C-axis preferred orientation, which reduces, for example, a performance and a quality factors of devices. In order to address the above issue, a solidly mounted resonator having an electromagnetic shielding structure and a method for manufacturing the solidly mounted resonator are provided according to embodiments of the present disclosure.

In a first aspect, a solidly mounted resonator having an electromagnetic shielding structure is provided. The solidly mounted resonator includes: a substrate, an acoustic-wave reflecting layer formed on the substrate, a resonance function layer formed on the acoustic-wave reflecting layer, and a metal shielding wall formed on the substrate, where the metal shielding wall surrounds an effective region in the acoustic-wave reflecting layer and the resonance function layer. That is, the solidly mounted resonator is provided with the metal shielding wall which is formed during fabrication. The electromagnetic shielding structure has a compact structure and a small volume, is capable to provide shielding against both external and internal electromagnetic interferences, and further improves heat dissipation of a filter during operation.

In an embodiment, the acoustic-wave reflecting layer includes at least two pairs of dielectric reflection layers and metal reflection layers, the dielectric reflection layers and the metal reflection layers are stacked in an interleaved manner, and the resonance function layer includes a lower electrode layer, a piezoelectric layer, and an upper electrode layer, which are stacked in the above-listed sequence. The resonance function layer is configured to implement conversion between electrical energy and mechanical energy via the piezoelectric layer, and the mechanical energy is in a form of acoustic waves. The acoustic-wave reflecting layer is characterized by having alternating high and low acoustic impedance, and thus is capable to reflect the acoustic waves effectively. Therefore, an energy loss of the acoustic waves is avoided, and the acoustic waves within an effective resonance range can resonate.

In an embodiment, the metal shielding wall is formed by a stack of multiple metal rings, where each of the multiple metal rings is disposed in a same level as a corresponding layer of the acoustic-wave reflecting layer and the resonance function layer. The above same-level configuration simplifies fabrication, because the metal shielding wall can be gradually formed when fabricating each functional layer.

In an embodiment, multiple metal rings include metal rings that are disposed in a same level as the dielectric reflection layers, the metal reflection layers, the lower electrode layer, the piezoelectric layer, respectively. The above same-level configuration simplifies fabrication and facilitates using mature techniques.

In an embodiment, all of the multiple metal rings in the metal shielding wall are electrically connected. Hence, the metal shielding wall when grounded has the electromagnetic shielding function.

In an embodiment, the metal shielding wall is an integral closed metal wall, and is integrally formed in the acoustic-wave reflecting layer and the lower electrode layer at a periphery of the effective region. In such case, the metal shielding wall is formed through a simple process, and the closed metal shielding wall has a stable performance.

In an embodiment, a metal shielding layer is formed between the substrate and the acoustic-wave reflecting layer, and the metal shielding wall is in contact with and is electrically connected to the metal shielding layer. The metal shielding layer and the metal shielding wall are connected for grounding, so that the acoustic wave refection layer and the resonance function layer are subject to complete electromagnetic shielding.

In an embodiment, the metal shielding wall is grounded. The metal shielding wall may be connected to outside and grounded via a path penetrating the piezoelectric layer, which simplifies fabrication.

In an embodiment, an electrode lead connects the upper electrode layer to outside of the solidly mounted resonator, and the metal shielding wall in a region in which the electrode lead is located does not extend higher than the piezoelectric layer. The electrode lead connecting the upper electrode layer provides resonance to the solidly mounted resonator, and does not contact the metal shielding wall, which avoids a short circuit and ensures a performance of the solidly mounted resonator.

In an embodiment, an encapsulation structure capping the upper electrode layer is provided at a top of the solidly mounted resonator. The encapsulation structure is capable to protect the resonance functional region and improve a certain degree of electromagnetic shielding.

According to a second aspect, a method for manufacturing a solidly mounted resonator having an electromagnetic shielding structure is provided. The method includes: S1, fabricating a piezoelectric layer on a first substrate; S2, fabricating a lower electrode layer and then an acoustic-wave reflecting layer on the lower electrode layer, and fabricating a first metal shielding wall on a periphery of the lower electrode layer and the acoustic-wave reflecting layer, where the first metal shielding wall surrounds an effective region in the lower electrode layer and the acoustic-wave reflecting layer; S3, bonding a second substrate onto the acoustic-wave reflecting layer; S4, removing the first substrate to expose a back surface of the piezoelectric layer, where the back surface faces away from the lower electrode layer; S5, etching the piezoelectric layer at a position corresponding to the first metal shielding wall, to expose at least a part of the first metal shielding wall; S6, fabricating a second metal shielding wall which fills a cavity in the piezoelectric layer and is electrically connected to the first metal shielding wall, where the cavity is formed by the etching; and S7, fabricating an upper electrode layer on the back surface of the piezoelectric layer.

In an embodiment, the step S2 includes: S21, fabricating the lower electrode layer on the piezoelectric layer, and simultaneously forming a first metal shielding ring on a periphery of the lower electrode layer, where the first metal shielding ring is disposed in a same level as the lower electrode layer and surrounds the lower electrode layer; and S22, fabricating the acoustic-wave reflecting layer on the lower electrode layer, and simultaneously forming a second metal shielding ring on the first metal shielding ring, where the second metal shielding ring is disposed in a same level as the acoustic-wave reflecting layer and surrounds the acoustic-wave reflecting layer, and an integral of the first metal shielding ring and the second metal shielding ring serves as the first metal shielding wall.

The first metal shielding ring and the second metal shielding ring are disposed in same levels as the lower electrode layer and the acoustic-wave reflecting layer, respectively, and thus can be fabricated from same horizontal layers with the lower electrode layer and the acoustic-wave reflecting layer, respectively, which simplifies implementation and facilitates using mature techniques.

In an embodiment, the step S21 includes: fabricating a first metal layer on the piezoelectric layer, and forming the lower electrode layer and the first metal shielding ring through photolithography and etching, where the first shielding ring surrounds the lower electrode layer and is not connected to the lower electrode layer. The first shielding ring surrounding the lower electrode layer provides good electromagnetic shielding for the lower electrode layer.

In an embodiment, the step S22 includes: S221, growing a dielectric reflection layer on a structure obtained through the steps before the step S22, and planarizing the dielectric reflection layer; S222, etching the dielectric reflection layer to expose the first metal shielding ring under the dielectric reflection layer, fabricating a second metal layer on the dielectric reflection layer, and planarzing the second metal layer to form another metal shielding ring on the first metal shielding ring, where the another metal shielding ring is flush with the dielectric reflection layer; S223, fabricating a third metal layer on the dielectric reflection layer to form a dual-functional layer, where the dual-functional layer includes a metal reflection layer on the dielectric reflection layer and yet another metal shielding ring surrounding the metal reflection layer; and S224, repeating the step S221 to the step S223 to obtain the acoustic-wave reflecting layer and the second metal shielding ring surrounding the acoustic-wave reflecting layer, where the acoustic-wave reflecting layer includes at least two pairs of the dielectric reflection layer and the metal reflection layer, and the dielectric reflection layers and the metal reflection layers are stacked in an interleaved manner.

The dielectric reflection layers and the metal reflection layers stacked in the interleaved manner to form the acoustic-wave reflecting layer, and the metal shielding rings are fabricated in same levels with these layers, respectively, through mature techniques such as polishing and etching, so as to form the second metal shielding ring surrounding the acoustic-wave reflecting layer and providing a good shielding effect. A surface of the fabricated piezoelectric layer is flat, which ensures uniformity with respect to stress and electromechanical coupling coefficients. Hence, a performance and a product yield of the resonators are improved.

In an embodiment, the step S2 includes: S21', fabricating a lower electrode layer and then an acoustic-wave reflecting layer on the lower electrode layer, and simultaneously forming a dielectric layer surrounding the lower electrode layer and the acoustic-wave reflecting layer; and S22', etching the dielectric layer to obtain a groove surrounding the lower electrode layer and the acoustic-wave reflecting layer, and filling the groove with a metal material to form the first metal shielding wall.

The first shielding wall surrounding the lower electrode layer and the acoustic-wave reflecting layer is formed by etching the dielectric layer and filling with the metal material, which simplifies processing. The integrally formed first shielding wall has a good shielding effect.

In an embodiment, the step S21 includes: S211', fabricating the lower electrode layer on the piezoelectric layer, and removing a peripheral part of the lower electrode layer; S212', fabricating a dielectric reflection layer on a structure obtained after the step S211', and planarizing the dielectric reflection layer; S213', fabricating a metal reflection layer on the dielectric reflection layer, and removing a peripheral part of the metal reflection layer; and S214', repeating the step S212' and the step S213' to form the acoustic-wave reflecting layer and the dielectric layer surrounding the acoustic-wave reflecting layer, where the acoustic-wave reflecting layer includes at least two pairs of the dielectric reflection layer and the metal reflection layer, and the dielectric reflection layers and the metal reflection layers are stacked in an interleaved manner.

The dielectric layer is formed by using the planarized dielectric reflection layers. In such case, the dielectric layer is formed simultaneously with the acoustic-wave reflecting layer, which simplifies processing. A surface of the fabricated piezoelectric layer is flat, which ensures uniformity with respect to stress and electromechanical coupling coefficients. Hence, a performance and a product yield of the resonators are improved.

In an embodiment, the step S22' includes: S221', fabricating a dielectric protection layer on a structure obtained through steps before the step S22'; S222', etching a peripheral part of the dielectric protection layer to obtain another groove which extends from a surface of the dielectric protection layer to the piezoelectric layer and surrounds the lower electrode layer and the acoustic-wave reflecting layer; and S223', filling the another groove with the metal material, where a surface of the metal material is flush with the dielectric protection layer.

The dielectric layer is disposed under the peripheral part of the dielectric protection layer. The first metal shielding wall surrounding the lower electrode layer and the acoustic-wave reflecting layer is formed through etching the peripheral part of the dielectric protection layer and filling with the metal material, which simplifies processing.

In an embodiment, before the step S1, the method further includes forming a seed layer on the first substrate, and the step S4 includes: removing the first substrate and the seed layer and thinning the piezoelectric layer, through grinding, chemical mechanical polishing, and trimming. The piezoelectric layer is grown on the seed layer that is absolutely flat, such that a surface of the piezoelectric layer is quite flat. After removing the first substrate and the seed layer, the piezoelectric layer is trimmed to have the flat surface, which ensures stress uniformity.

In an embodiment, the piezoelectric layer is made of AlN, and initial amorphous AlN in the piezoelectric layer is removed during the trimming. This step of removing the amorphous AlN improves c-axis orientation and piezoelectricity of the integral piezoelectric layer, and thereby improves performances of the resonator.

In an embodiment, the seed layer includes two or more layers formed through sputtering or deposition. The seed layer made of different materials can improve c-axis preferred orientation of the piezoelectric layer, improve selectivity of electrode materials improved, and reduce a manufacturing cost.

In an embodiment, the seed layer includes an AlN layer and a Mo layer, where the Mo layer is disposed on a surface of the AlN layer away from the first substrate. The Mo layer enhances a degree of preferred orientation of the piezoelectric layer.

In an embodiment, the seed layer includes: one of a Cr layer, an Ir layer, or a Pt layer, and a Mo layer disposed on a surface of the one of the Cr layer, the Ir layer, or the Pt layer away from the first substrate. The Mo layer is (1,1,0) oriented, and is capable to enhance the C-axis preferred orientation of a film layer that is subsequently formed.

In an embodiment, the seed layer includes a SiC layer and an AlN layer, where the AlN layer is disposed on a surface of the SiC layer away from the first substrate. The AlN layer is also capable to enhance the C-axis preferred orientation of a subsequent film layer.

In an embodiment, the AlN layer is c-axis oriented, that is, (0,0,0,2) oriented. In such case, the Mo layer with (1,1, 0) orientation may be obtained.

In an embodiment, the Mo layer is a body-centered cubic crystal and (1,1,0) oriented. The (1,1,0) oriented Mo is capable to enhance a degree of preferred orientation of the (0,0,0,2) oriented AlN in the piezoelectric layer. Hence, an acoustic loss can be reduced, and the resonator can maintain a required vibration mode at an operating frequency.

In an embodiment, the step S3 includes: fabricating a metal connection layer on the acoustic-wave reflecting layer, forming a metal layer on a surface of the second substrate through evaporation, and bonding the surface of the second substrate to the metal connection layer. The metal connection layer can provide good electromagnetic shielding for the device in a direction parallel to the acoustic-wave reflecting layer, and facilitate connection with the second substrate.

The solidly mounted resonator having the electromagnetic shielding structure and the method for manufacturing the same are provided according to embodiments of the present disclosure. The solidly mounted resonator includes the substrate, the acoustic-wave reflecting layer formed on the substrate, the resonance function layer formed on the acoustic-wave reflecting layer, and the metal shielding wall formed on the substrate. The metal shielding wall surrounds the effective region in the acoustic-wave reflecting layer and the resonance function layer. Additionally, the closed electromagnetic shielding structure is formed at a periphery of the effective region in the acoustic-wave reflecting layer and the resonance function layer. Thereby, the electromagnetic shielding structure is formed simultaneously with the resonator, and it is not necessary to provide an additional electromagnetic shielding device. Hence, an influence of an external or internal electromagnetic interference source on the resonator is avoided while ensuring a small dimension and a high performance of the resonator. Signal isolation of radio-frequency terminal products is greatly enhanced, and hence noise signals are suppressed, especially for adjacent frequency bands and signal transmitters. In addition, the electromagnetic shielding layer can enhance heat dissipation of operating filters to a certain extent. A surface of the piezoelectric layer obtained through the above solution is flat, which ensures uniformity with respect to stress and electromechanical coupling coefficients. Hence, a performance and a product yield of the resonators can be improved.

BRIEF DESCRIPTION OF THE DRAWINGS

The drawings are included herein to provide further understanding of embodiments and are incorporated herein to constitute a part of this specification. The drawings illustrate embodiments of the present disclosure and explain the principles of the present disclosure in conjunction with description. Various advantages of these embodiments as well as other embodiments may refer to following detailed description and hence can be well understood. Elements in the drawings may not be depicted in scale. Identical numerals represent corresponding parts which are similar.

DETAILED DESCRIPTION

Figure 1:
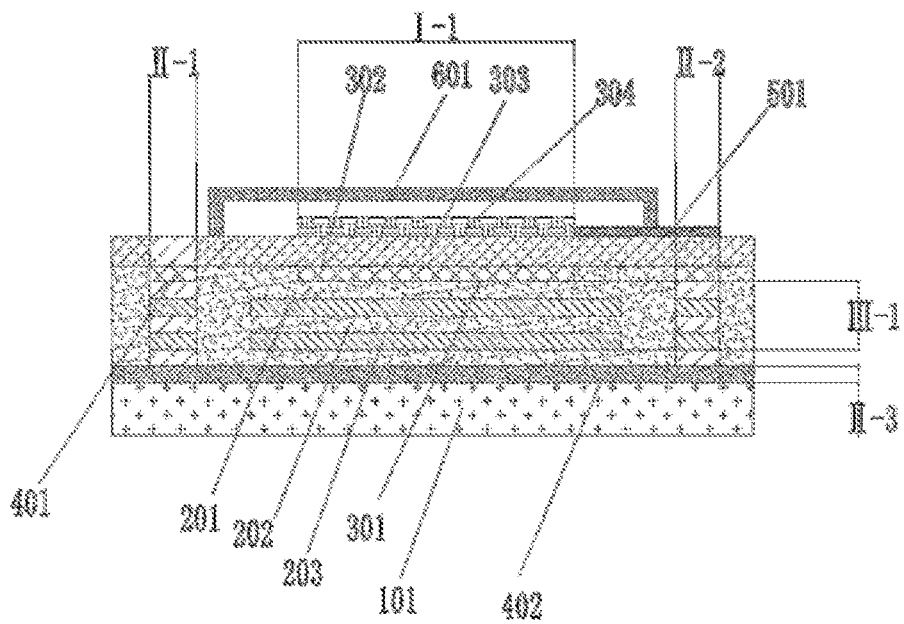
FIG. 1 shows a schematic structural diagram of a solidly mounted resonator having an electromagnetic shielding structure according to an embodiment of the present disclosure.

Hereinafter the present disclosure is further illustrated in detail with reference to the drawings and embodiments. It should be understood that specific embodiments described herein are merely intended for explaining related solutions, rather than limiting the present disclosure. It is noted that only components related to solutions are depicted in the drawings to facilitate description. It is further noted that dimensions and sizes of the components in the drawings are not depicted to scale, and a size of a certain component may be exaggerated for prominence.

Embodiments of the present disclosure and features in the embodiments may be combined with each other as long as there is no conflict. Hereinafter the present disclosure is described in detail with reference to the drawings in conjunction with the embodiments.

A solidly mounted resonator having an electromagnetic shielding structure is provided according to an embodiment of the present disclosure. As shown in FIG. 1, the solidly mounted resonator includes a substrate 101, an acoustic-wave reflecting layer 201 formed on the substrate 101, and a resonance function layer 301 formed on the acoustic-wave reflecting layer 201. The acoustic-wave reflecting layer 201 includes metal layers and dielectric film layers, which are mismatched in acoustic impedance and stacked in an interleaved manner. Hence, the acoustic-wave reflecting layer 201 has alternating high and low acoustic impedance, and thereby is capable to reflect acoustic waves effectively and suppress an energy loss of the acoustic waves. Therefore, the acoustic waves within an effective resonance range are capable to resonate. The resonant function layer 301 is configured to implement conversion between electrical energy and mechanical energy, and induce a resonant effect. The resonator further includes a metal shielding wall 401 formed on the substrate 101. The metal shielding wall 401 is disposed at a periphery of an effective region, which is of the acoustic-wave reflecting layer 201 and the resonance function layer 301, and surrounds such effective region. The metal shielding wall 401 which serves as electromagnetic shielding layer is fabricated along with the resonator. An influence of an external or internal electromagnetic interference source on the resonator is avoided while ensuring a small dimension and a high performance of the resonator. Signal isolation of radio-frequency terminal products is greatly enhanced, and hence noise signals are suppressed, especially for adjacent frequency bands and signal transmitters.

Reference is made to FIG. 1. In a specific embodiment, the acoustic-wave reflecting layer 201 includes at least two pairs of a dielectric reflection layer 202 and a metal reflection layer 203, and the dielectric reflection layers and metal reflection layers are stacked in an interleaved manner. The resonance function layer 301 includes a lower electrode layer 302, a piezoelectric layer 303, and an upper electrode layer 304, which are stacked in the above-listed sequence. In FIG. 1, the region I-1 represents the effective region of the resonator. The region II-1 and the region II-2 represents a region of the metal shielding wall 401, the region II-3 represents a region of a metal shielding layer 402, and the region III-1 represents a region of the acoustic-wave reflecting layer 201. Each of the regions I, II, and III is occupied by a planar structure or planar structures which are stacked, and hence have a simple structure which is easy to fabricate. Moreover, the piezoelectric layer 303 in the above structure has a flat surface, which ensures uniformity with respect to stress and electromechanical coupling coefficients. Hence, a performance and a product yield of the resonators can be improved.

In a specific embodiment, the metal shielding wall 401 is formed by a stack of multiple metal rings, which are in same levels as the acoustic-wave reflecting layers 201 and the resonance function layers 301, respectively. Hence, the metal shielding wall 401 can be formed by stacking the multiple metal rings. In a preferable embodiment, the metal rings are in same levels as the dielectric reflection layer 202, the metal reflection layer 203, the lower electrode layer 302, and the piezoelectric layer 303, respectively. That is, when fabricating each of the dielectric reflection layer 202, the metal reflection layer 203, the lower electrode layer 302, and the piezoelectric layer 303, a metal layer or a dual-functional layer at a periphery of the fabricated layer is retained, and the metal layers and the dual-functional layers are stacked along with the sequential fabrication of these layers, so as to form the metal shielding wall 401. Arranging each metal ring to be in a same level as a corresponding one of the dielectric reflection layer 202, the metal reflection layer 203, the lower electrode layer 302, or the piezoelectric layer 303 simplifies processing and facilitates using mature techniques. In the same level as the piezoelectric layer 303, there is a region, such as the region II-1, which has a metal ring, and there is another region, such as a part of the region II-2 not exceeding the piezoelectric layer 303, which does not having a metal ring, that is, the metal shielding wall in such region does not extend higher than the piezoelectric layer 303. In a preferable embodiment, all metal rings of the metal shielding wall 401 are electrically connected. The electrical connection among the metal rings strengthens the electromagnetic shielding of the metal shielding wall 401 when the metal rings are grounded.

Figure 2:
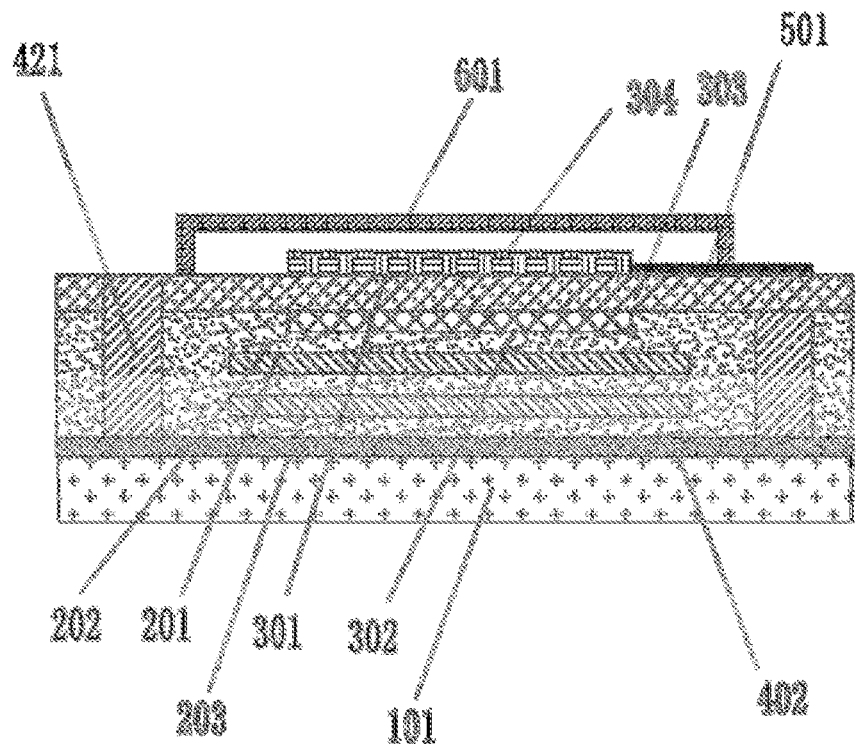
FIG. 2 shows a schematic structural diagram of a solidly mounted resonator having an electromagnetic shielding structure according to another embodiment of the present disclosure.

Reference is made to FIG. 2. In a specific embodiment, a metal shielding wall 421 is a closed metal wall which is formed as an integral at a periphery of the effective region in the acoustic-wave reflecting layer 201 and the lower electrode layer 302. In such case, the closed metal wall formed as an integral serves as the electromagnetic shielding wall on the periphery of the acoustic-wave reflecting layer 201 and the lower electrode layer 302. The metal shielding wall 421 simplifies fabrication, and the closed metal wall is stable in performances. The metal shielding wall 421 formed by the closed metal wall and the metal shielding wall 401 formed by multiple metal rings are identical in shapes and positions, and are different in materials and manufacturing processes. Both metal shielding walls have a good electromagnetic shielding effect.

Figure 3:
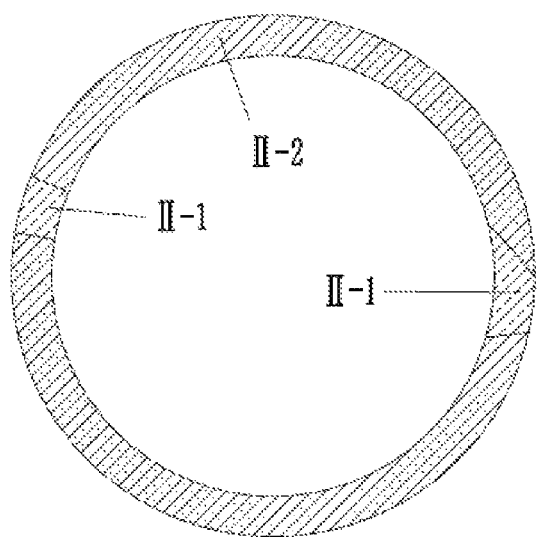
FIG. 3 shows a top view of a metal shielding wall of a solidly mounted resonator having an electromagnetic shielding structure according to an embodiment of the present disclosure.

In a specific embodiment, a metal shielding layer 402 is formed between the substrate 101 and the acoustic-wave reflecting layer 201. The metal shielding wall 401 and the metal shielding layer 402 are in contact and electrically connected with each other. As shown in FIG. 1, the region II-1, the region II-2, and the region II-3 having the metal shielding layer 402 constitutes an electrically conductive structure, and may be regarded as an integral region of the metal shielding wall 401. The metal shielding wall 401 in the region II and the metal shielding layer 402 surrounds the region I-1 serving as the effective region of the resonator and the region III-1 serving as the region of the acoustic-wave reflecting layer 201. A top view of the surrounding wall is not limited to a circular ring structure as shown in FIG. 3, and may alternatively be square or any other closed shape. At least a part of the wall in the region II-1 is connected to the ground, and the wall in the region II-2 does not extend higher than the piezoelectric layer 303, so as to ensure normal operation of the resonator. The metal shielding layer 402 in the region II-3 is in contact with an entire surface of the substrate 101. Heat dissipation of the operating filter can be improved to a certain extent.

In a specific embodiment, the metal shielding wall 401 is grounded. The metal shielding wall 401 may be grounded via a path penetrating the piezoelectric layer 303, which simplifies implementation. Specifically, the wall is connected to the ground at at least one position in the region II-1, or the wall in the region II-1 is connected to the ground throughout the region II-1. The grounded metal shielding wall 401 provides an electrically conductive structure which is formed by the wall in the regions II-1 and II-2 and the metal shielding layer 402t in the region II-3 and which protects the acoustic-wave reflecting layer 201 and resonance function layer 301 against electromagnetic interferences of an external or internal source. Signal isolation of radio-frequency terminal products is greatly enhanced, and hence noise signals are suppressed, especially for adjacent frequency bands and signal transmitters.

In a specific embodiment, an electrode lead 501 is provided for connecting the upper electrode layer 304 to outside, and the metal shielding wall 401 in a region in which the electrode lead 501 is disposed does not extend higher than the piezoelectric layer 303. In such case, as shown in the drawings, the metal shielding wall 401 in the region II-2 does not extend higher than the piezoelectric layer 303. The electrode lead 501 is connected to the upper electrode layer 304 to enable the resonance function. The electrode lead 501 is not connected to the metal shielding wall 401 to prevent a short circuit that influences a performance of the resonator.

In a specific embodiment, an encapsulation structure 601 capping the upper electrode layer 304 is provided at a top of the resonator. On one hand, the encapsulation structure 601 is capable to protect the effective resonance functional region, that is, the region I-1. On the other hand, the encapsulation structure 601 provides a certain degree of electromagnetic shielding. The encapsulation structure 601, the metal shielding wall 401 in the region II, and the metal shielding layer 402 form a complete electromagnetic shielding layer, which surrounds the acoustic-wave reflecting layer 201 and the resonance function layer 301 completely, isolates electromagnetic interferences between adjacent frequency bands and between signal transmitters, and enhance signal isolation of radio frequency terminal products effectively.

Figure 4:
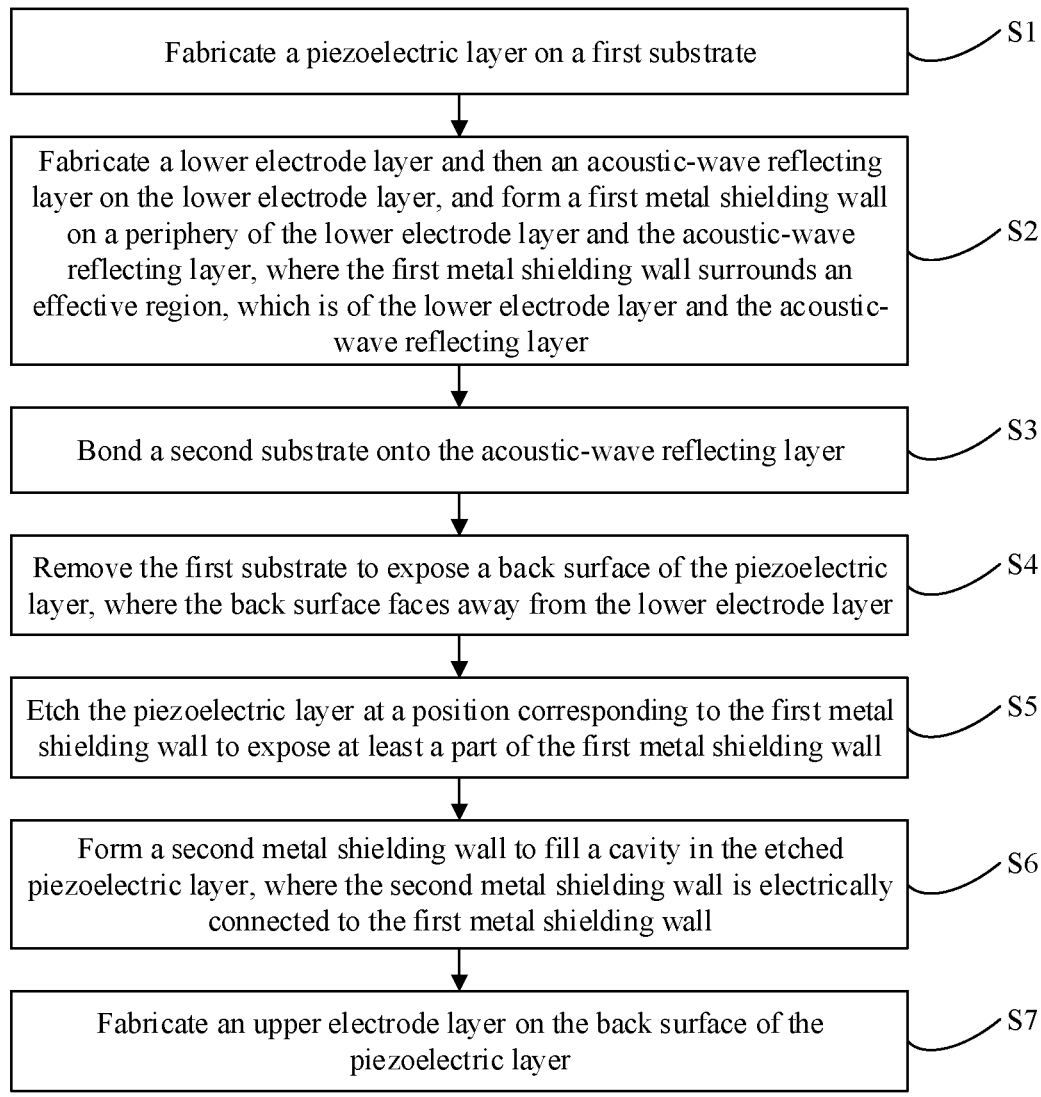
FIG. 4 shows a flow chart of a method for manufacturing a solidly mounted resonator having an electromagnetic shielding structure according to an embodiment of the present disclosure.

A method for manufacturing a solidly mounted resonator with an electromagnetic shielding structure is further provided according to an embodiment of the present disclosure. Reference is made to FIG. 4, where the method includes steps S1 to S7.

In step S1, a piezoelectric layer is fabricated on a first substrate.

In step S2, a lower electrode layer and then an acoustic-wave reflecting layer are fabricated on the lower electrode layer, and a first metal shielding wall is formed on a periphery of the lower electrode layer and the acoustic-wave reflecting layer. In the lower electrode layer and the acoustic-wave reflecting layer, the first metal shielding wall surrounds an effective region.

In step S3, a second substrate is bonded onto the acoustic-wave reflecting layer.

In step S4, the first substrate is removed to expose a back surface of the piezoelectric layer. The back surface of the piezoelectric layer faces away from the lower electrode layer.

In step S5, the piezoelectric layer is etched at a position corresponding to the first metal shielding wall, so as to expose at least a part of the first metal shielding wall.

In step S6, a second metal shielding wall is formed to fill a cavity of the etched piezoelectric layer. The second metal shielding wall is electrically connected to the first metal shielding wall.

In step S7, an upper electrode layer is fabricated on the back surface of the piezoelectric layer.

First Embodiment

Figure 5A:
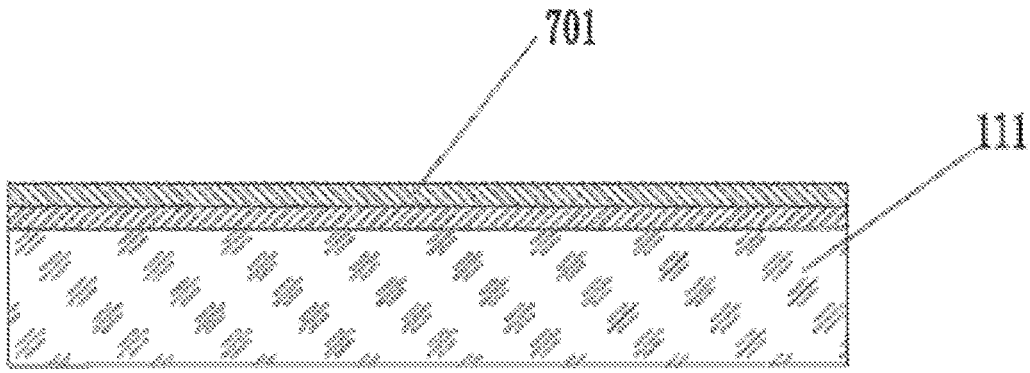
FIG. 5a to FIG. 5s show schematic structural diagrams of a solidly mounted resonator having an electromagnetic shielding structure during a method according to a first embodiment of the present disclosure.

FIG. 5a to FIG. 5i are schematic structural diagrams of a solidly mounted resonator having an electromagnetic shielding structure during a method according to an embodiment of the present disclosure. Before the step S1, the method further includes a following step. A seed layer 701 is fabricated on the first substrate 111. Reference is made to FIG. 5a. In a preferable embodiment, the seed layer 701 includes two or more layers, which are formed through sputtering or deposition. A material of the first substrate 111 is Si. The seed layer 701 fabricated on the first substrate 111 by using different materials can lead to a piezoelectric layer 303 having good C-axis preferred orientation, improve selectivity of electrode materials, and reduce a manufacturing cost. In an embodiment, the seed layer 701 includes an AlN layer and a Mo layer. The Mo layer is disposed on a surface of the AlN layer away from the first substrate. The AlN layer has a thickness approximating 50 nm, and is c-axis oriented, that is, (0,0,0,2)-oriented. The Mo layer has a thickness approximating 50 nm, and is a body-centered cubic crystal with (1,1,0) orientation. The first substrate 111 made of Si and the (0,0,0,2)-oriented AlN layer enhance a degree of preferred orientation of the (1,1,0)-oriented Mo.

In another embodiment, the seed layer 701 includes a Mo layer and one of a Cr layer, an Ir layer, or a Pt layer, and the Mo layer is disposed on a surface of the one of the Cr layer, the Ir layer, or the Pt layer away from the first substrate 111. The Cr layer, the Ir layer, or the Pt layer is first grown on the first substrate 111 through MOCVD. Then, a monocrystalline or polycrystalline Mo layer is formed by controlling factors such as temperature, pressure, a gas flow, and air tightness. The Mo layer is Mo (1,1,0) oriented, which enhances the C-axis preferred orientation of a subsequent film layer.

In another embodiment, the seed layer 701 includes a SiC layer and an AlN layer, and the AlN layer is disposed on a surface of the SiC layer away from the first substrate 111. The SiC layer is first grown on the first substrate 111 through MOCVD. Then, a monocrystalline or polycrystalline AlN layer is formed by controlling factors such as temperature, pressure, a gas flow, and air tightness. Hence, the C-axis preferred orientation of a subsequent film layer is enhanced. The AlN layer is (0,0,0,2)-oriented.

Figure 5B:
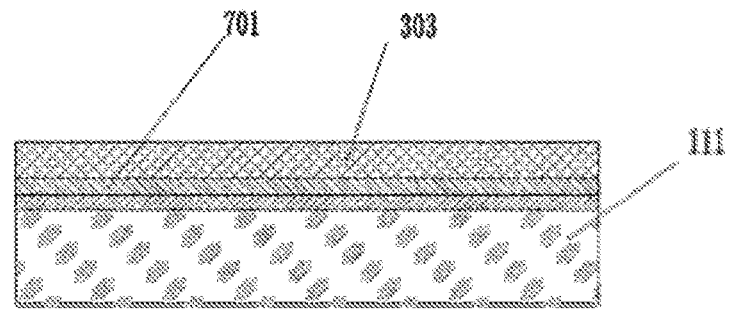

Reference is made to FIG. 5b. A piezoelectric layer 303 is disposed on the seed layer 701 through sputtering process. The piezoelectric layer 303 is a (0,0,0,2)-oriented AlN layer. In conventional technology, Mo is usually selected as a material of the lower electrode layer 302 to obtain c-axis oriented AlN, and candidates of the material of the lower electrode layer 302 is very limited. In embodiments of the present disclosure, the AlN which is highly c-axis oriented is directly obtained through growth on the composite seed layer 701, and hence there are fewer limitations on electrode materials.

Figure 6:
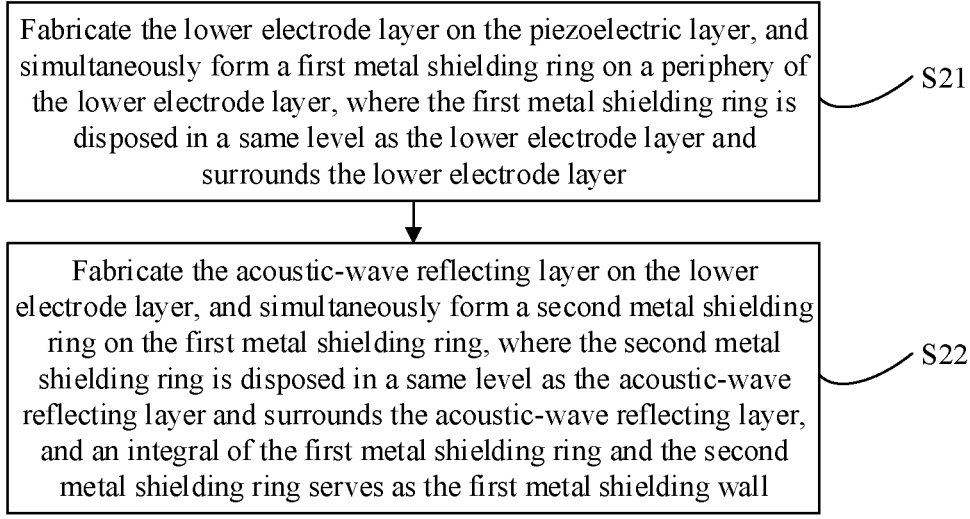
FIG. 6 shows a flowchart of step S2 of a method for manufacturing a solidly mounted resonator having an electromagnetic shielding structure according to a first embodiment of the present disclosure.

Reference is made to FIG. 6. The step S2 includes following sub-steps S21 and S22.

In step S21, a lower electrode layer is fabricated on the piezoelectric layer, and a first metal shielding ring is simultaneously formed at a periphery of the lower electrode layer. The first metal shielding ring is disposed in a same level as the lower electrode layer and surrounds the lower electrode layer.

In step S22, the acoustic-wave reflecting layer is fabricated on the lower electrode layer, and a second metal shielding ring is simultaneously formed on the first metal shielding ring. The second metal shielding ring is disposed in a same level as the acoustic-wave reflecting layer and surrounds the acoustic-wave reflecting layer. An integral of the first metal shielding ring and the second metal shielding ring serves as the first metal shielding wall.

Figure 5C:
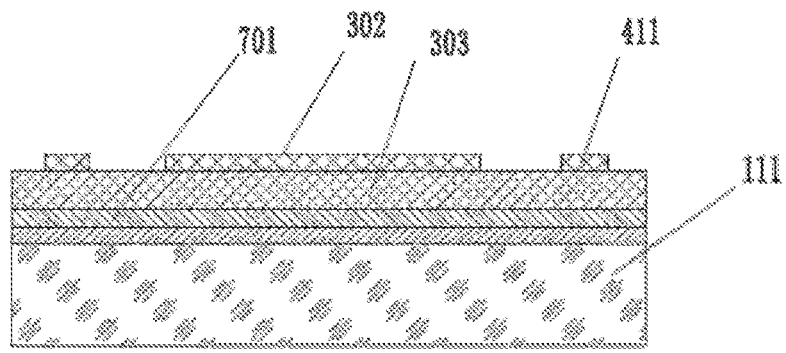

Reference is made to FIG. 5c. In a specific embodiment, the step S21 specifically includes following steps. A first metal layer is fabricated on the piezoelectric layer 303 through processing such as sputtering. Then, the first metal layer is photolithographed and etched to form the lower electrode layer 302 and the first metal shielding ring 411. The first shielding ring 411 surrounds the lower electrode layer 302 and is not connected to the lower electrode layer 302. The first metal shielding ring 411 surrounding the lower electrode layer 302 provides good electromagnetic shielding for the lower electrode layer 302.

Figure 7:
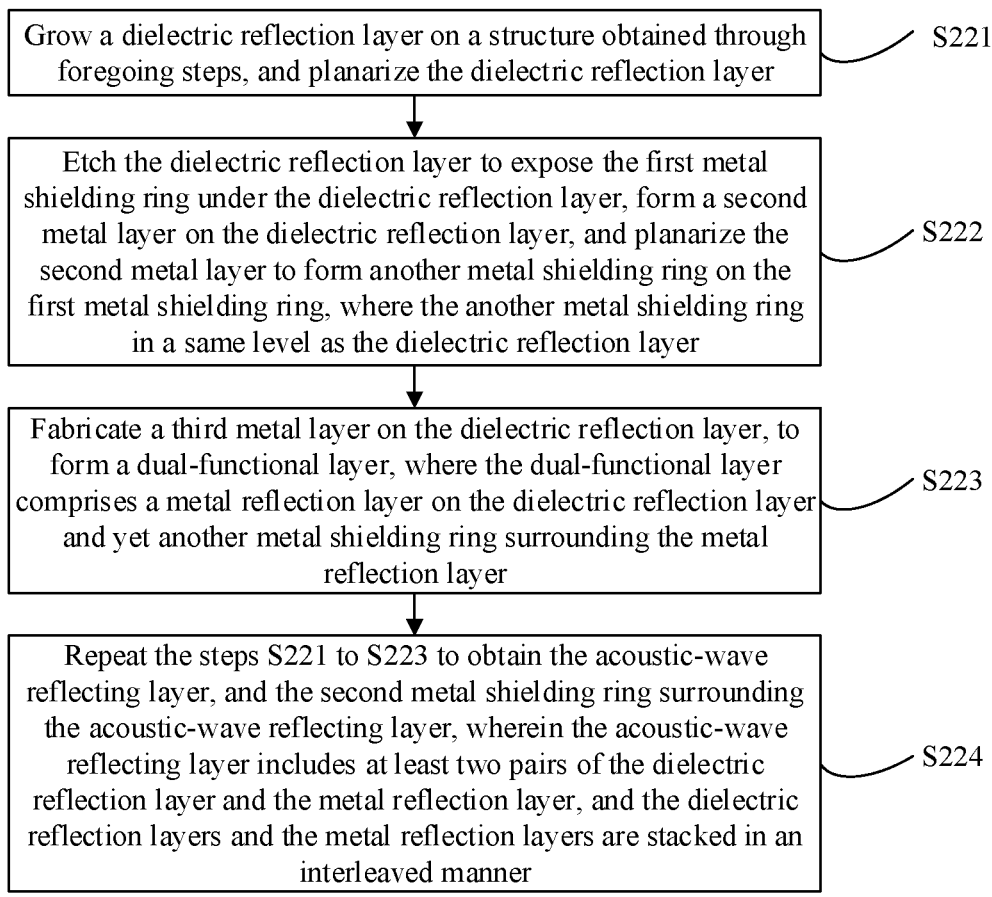
FIG. 7 shows a flowchart of step S22 of a method for manufacturing a solidly mounted resonator having an electromagnetic shielding structure according to a first embodiment of the present disclosure.

Reference is made to FIG. 7. In a specific embodiment, the step S22 includes following sub-steps S221 to S224.

In step S221, a dielectric reflection layer is grown on a structure obtained through foregoing steps, and then is planarized.

In step S222, the dielectric reflection layer is etched to expose the first metal shielding ring under the dielectric reflection layer, then a second metal layer is fabricated on the dielectric reflection layer, and the second metal layer is planarized to form another metal shielding ring which is in a same level as the dielectric reflection layer.

In step S223, a third metal layer is fabricated on the dielectric reflection layer to form a dual-functional layer. The dual-functional layer includes a metal reflection layer on the dielectric reflection layer and a metal shielding ring surrounding the metal reflection layer.

In step S224, the steps S221 to S223 are repeated to obtain the acoustic-wave reflecting layer and the second metal shielding ring surrounding the acoustic-wave reflecting layer. The acoustic-wave reflecting layer includes at least two pairs of the dielectric reflection layer and the metal reflection layer, and the dielectric reflection layers and the metal reflection layers are stacked in an interleaved manner.

Figure 5D:
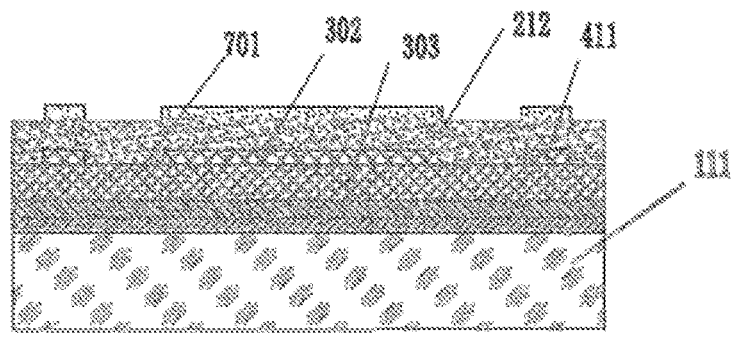
Figure 5E:
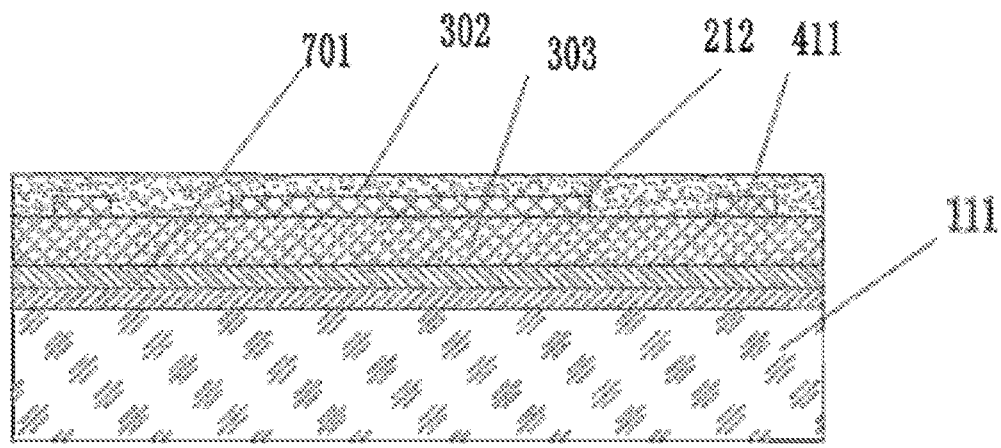

Reference is made to FIG. 5d. The dielectric reflection layer 212 is grown through CVD. A material of the dielectric reflection layer 212 is $SiO_2$, doped $SiO_2$, or other dielectric materials such as SiOF. Reference is made to FIG. 5e. An upper surface of the dielectric reflection layer 212 is planarized through chemical mechanical polishing (CMP). After the planarization, a thickness of the dielectric reflection layer 212 remaining on the lower electrode layer 302 is ¼ of a longitudinal wavelength $\lambda$ of the resonator. The thickness may be tuned based on influences of materials of the dielectric reflection layer 212 and the metal reflection layer 213.

Figure 5F:
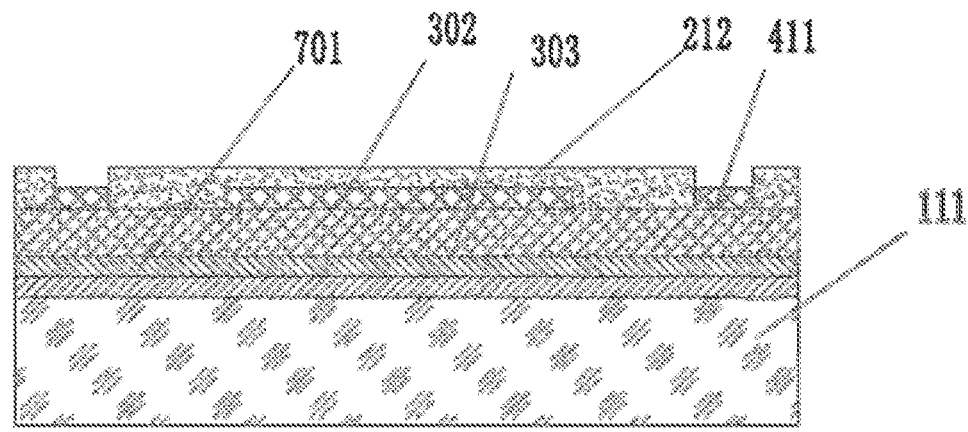
Figure 5G:
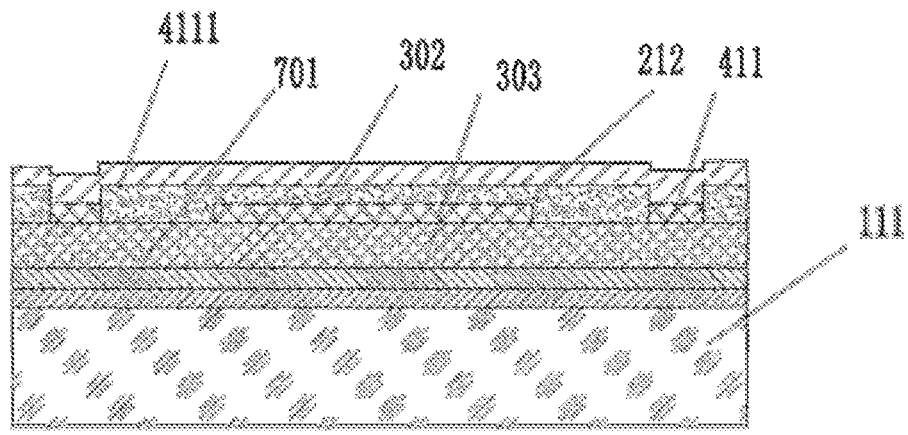
Figure 5H:
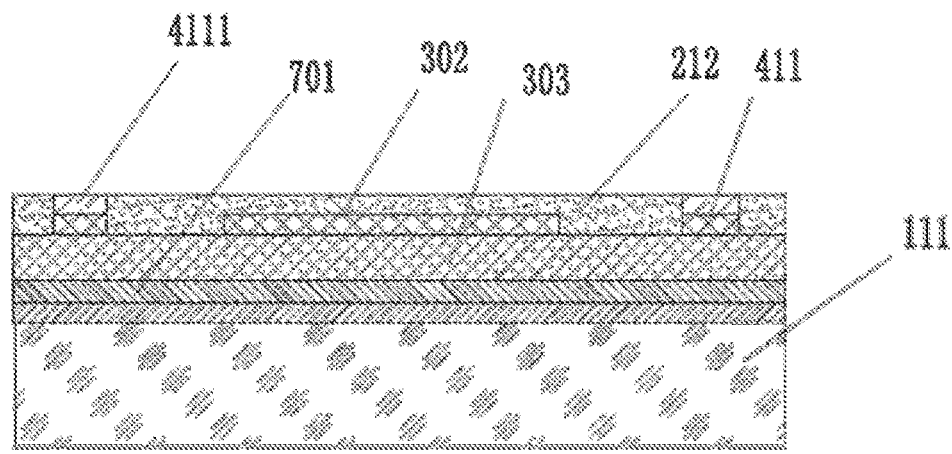

Reference is made to FIG. 5f and FIG. 5g. The dielectric reflection layer 212 is etched to expose the first metal shield ring 411 under the dielectric reflection layer 212. Then, a second metal layer 4111 is formed through photolithography, etching, and sputtering (or electroplating, vapor deposition, or the like). A material of the second metal layer is Cu or W. Afterwards, an upper surface of the second metal layer is planarized through CMP. Reference is made to FIG. 5h. A metal shielding ring, of which an upper surface is flush with an upper surface of the dielectric reflection layer 212, is formed from the second metal layer 4111 after the planarization.

Figure 5I:
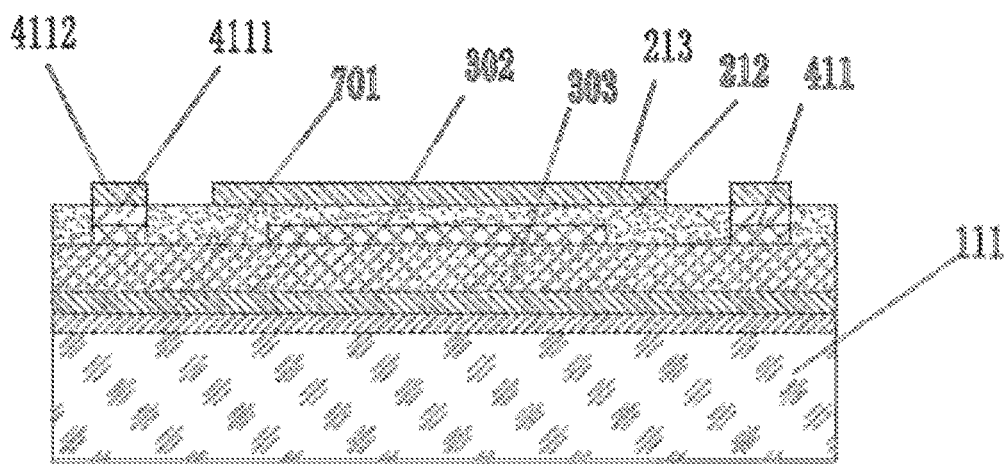
Figure 5J:
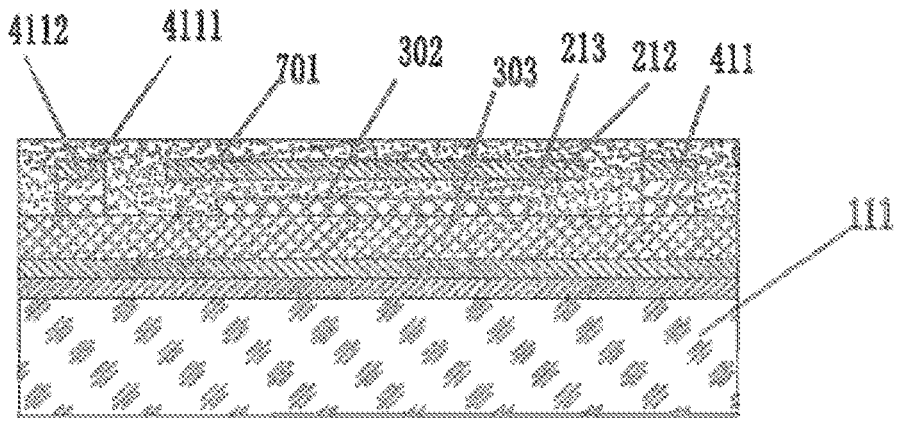
Figure 5K:
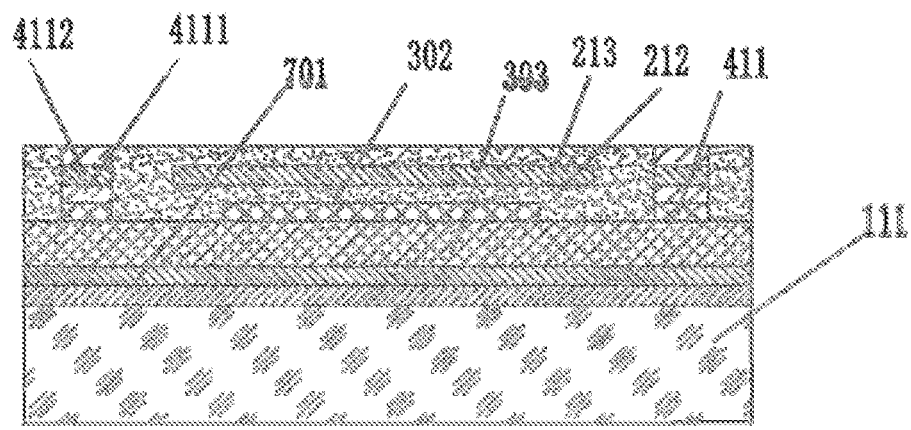
Figure 5L:
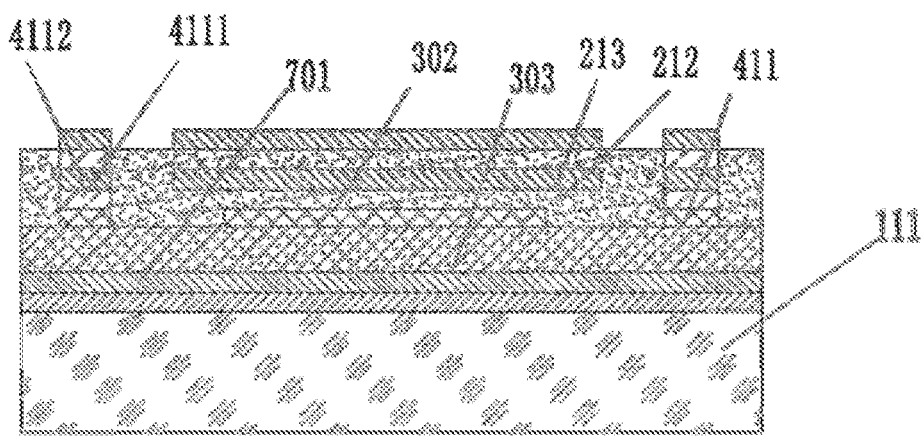
Figure 5M:
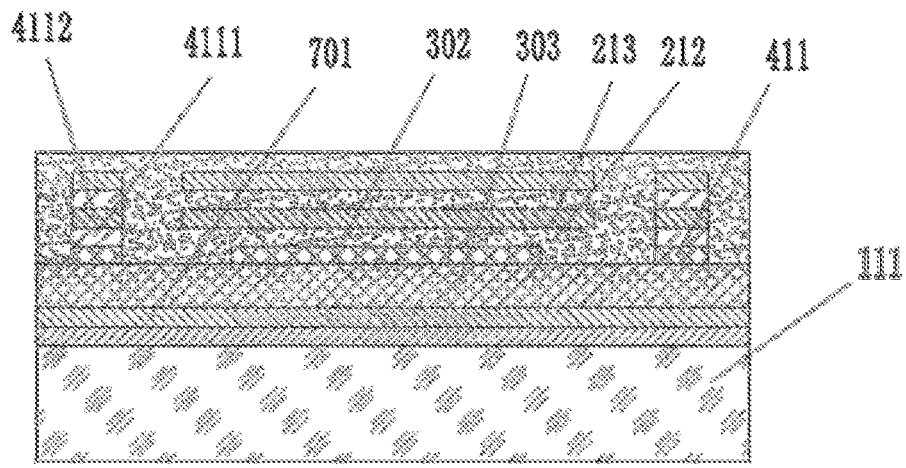

Reference is made to FIG. 5i. A third metal layer 4112 is fabricated on the dielectric reflection layer 212 through photolithography, sputtering, and etching, so as to form a dual-functional layer. The dual-functional layer includes a metal reflection layer 213 on the dielectric reflection layer 212 and a metal shielding ring surrounding the metal reflection layer 213. A thickness of the metal reflection layer 213 is ¼ of the longitudinal wavelength $\lambda$ of the resonator. A material of the third metal layer may include tungsten, aluminum, molybdenum, platinum, ruthenium, or the like.

Figure 5N:
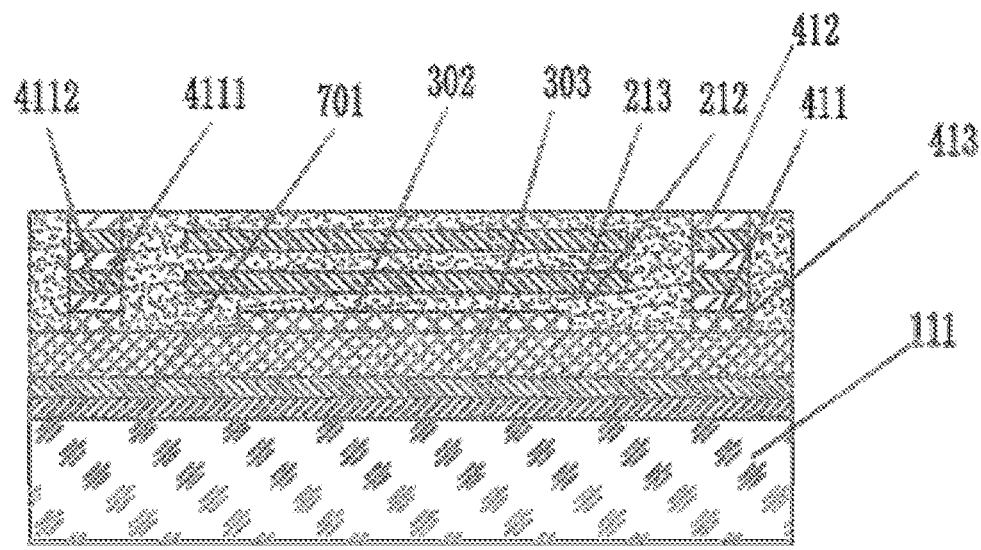

Reference is made to FIG. 5j to FIG. 5m. At least another pair of the dielectric reflection layer 212 and the metal reflection layer 213 having same thicknesses is further fabricated on the formed metal reflection layer 213 through processing such as CVD, CMP, and etching. Reference is made to FIG. 5n. As a last step, a metal ring is formed on a topmost dielectric reflection layer 212 through photolithography, etching, sputtering (or electroplating, evaporation, or the like) and CMP, to form the second metal shield ring 412 surrounding the acoustic-wave reflecting layer 211. The dielectric reflection layers 212 and the metal reflection layers 213 that are stacked in the interleaved manner form the acoustic-wave reflecting layer 211. The second metal shielding ring 412 is formed in the same level through mature processing such as polishing and etching. Thereby, the second metal shielding ring 412 surrounding the acoustic-wave reflecting layer 211 provide good shielding. An integral of the first metal shielding ring 411 and the second metal shielding ring 412 serves as the first metal shielding wall 413. Moreover, a surface of the piezoelectric layer 303 is flat, which ensures uniformity with respect to stress and electromechanical coupling coefficients. Hence, a performance and a product yield of the resonators can be improved.

Figure 5O:
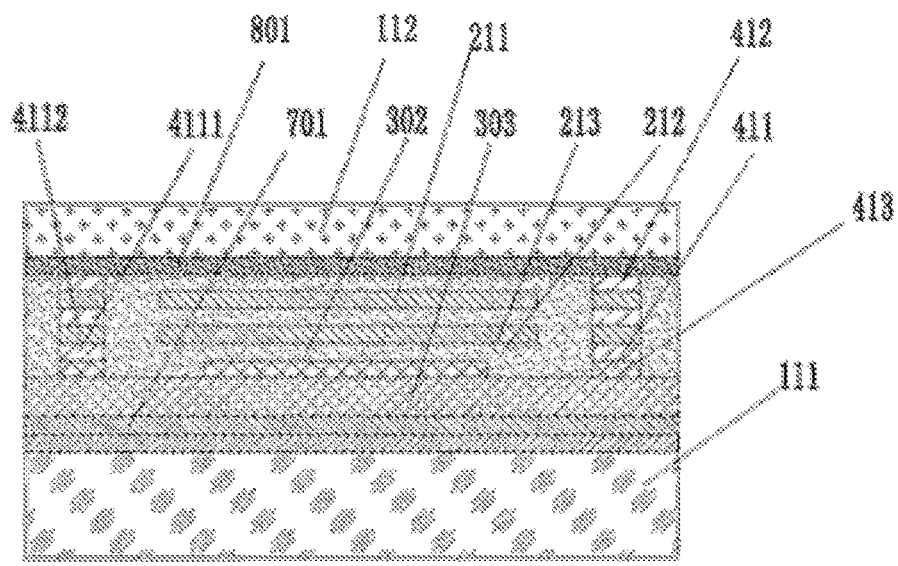

Reference is made to FIG. 5o. In a specific embodiment, the step S3 specifically includes following steps. A metal connection layer 801 is fabricated on the acoustic-wave reflecting layer 211. A metal layer is formed on a surface of the second substrate 112 through evaporation. The surface of the second substrate 112 is bonded to the metal bonding layer 801. The metal connection layer 801 provides good electromagnetic shielding for the resonator in a direction parallel with an extending direction of the acoustic-wave reflecting layer, and facilitates connection with the second substrate 112. In a preferable embodiment, the second substrate 112, which is subject to metal vaporization, is bonded onto the metal bonding layer 801 through wafer bonding techniques. The second substrate 112 is made of Si, and the metal vaporization ensures strength of a bonding force.

Figure 5P:
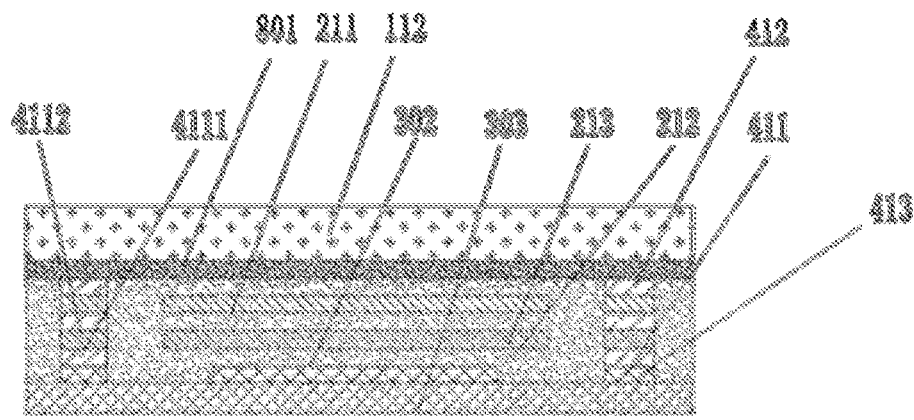

Reference is made to FIG. 5p. The step S4 specifically includes following steps. The first substrate 111 is removed, the seed layer 701 is removed, and the piezoelectric layer 303 is thinned, through grinding, chemical mechanical polishing, and trimming. In a preferable embodiment, a material of the piezoelectric layer is AlN, and the initial amorphous AlN in the piezoelectric layer 303 is removed during the trimming. In a preferable embodiment, the piezoelectric layer 303 may be thinned by 30 nm to 50 nm. The seed layer 701 is beneficial to forming the piezoelectric layer 303, the upper electrode layer 304, and the lower electrode layer 302, which have good C-axis preferred orientation on the seed layer 701. Hence, there are fewer limitations on candidates of the electrode materials. Removing the amorphous AlN on the piezoelectric layer 303 by 30 nm to 50 nm improves piezoelectricity and an operation performance of the resonator. When growing the AlN piezoelectric layer 303 (for example, having a thickness of 1000 nm), the initial 30 nm to 50 nm AlN is amorphous, which may affect a performance of the piezoelectric layer. Such 30 nm to 50 nm amorphous AlN may be trimmed to obtain a AlN piezoelectric layer having good c-axis orientation. Therefore, the solidly mounted resonator having the electromagnetic shielding structure can have a better piezoelectric performance.

Figure 5Q:
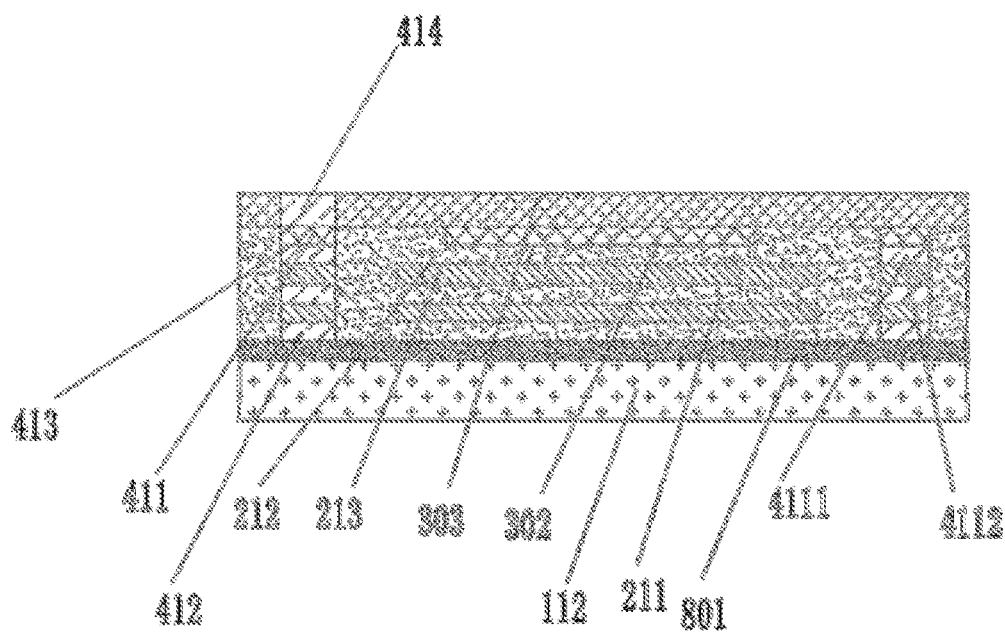

Reference is made to FIG. 5q. A second metal shielding wall 414 is fabricated through photolithography, etching, sputtering (or electroplating, evaporation, etc.) and CMP. A material of the second metal shielding wall 414 is Cu or W. The second metal shielding wall 414 after being planarized is flush with the piezoelectric layer 303. A quantity of the second metal shielding walls 414 is not limited herein. At least one second metal shielding wall 414 is electrically connected to outside via a path through the piezoelectric layer 303, and is electrically connected to the first metal shielding wall 413 under the piezoelectric layer 303 for grounding.

Figure 5R:
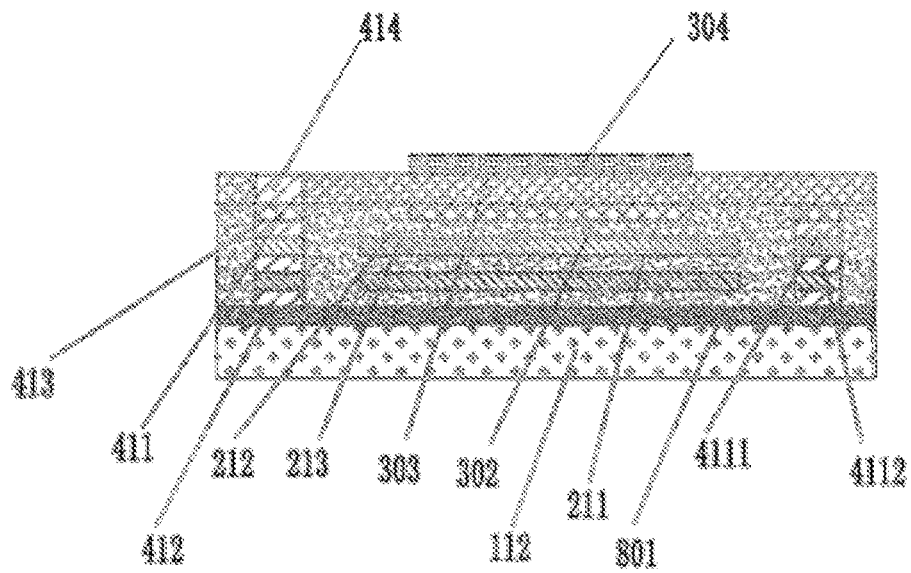

Reference is made to FIG. 5r. An upper electrode layer 304 is fabricated on a back surface of the piezoelectric layer 303 through photolithography, sputtering, and etching. A material of the upper electrode layer 304 may be Mo, or may be tungsten, aluminum, molybdenum, platinum, ruthenium, or a combination thereof.

Figure 5S:
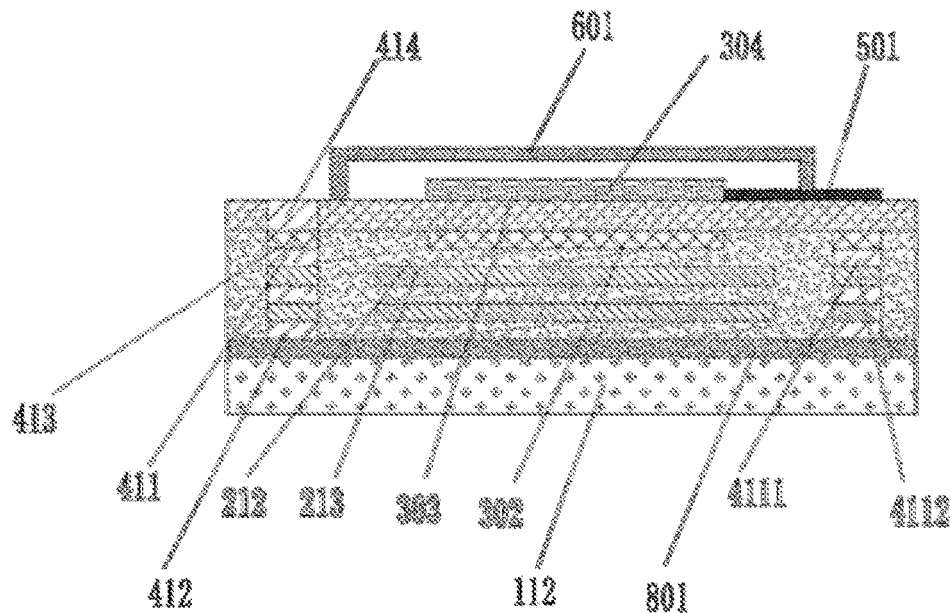

Reference is made to FIG. 5s. An encapsulation structure 601 capping the upper electrode layer 304 is formed on the piezoelectric layer 303. The second metal shielding wall 414 is grounded. The upper electrode layer 304 is provided with an electrode lead 501 connected to the outside, and the metal shielding wall 413 in a region in which the electrode lead 501 is located does not extend higher than the piezoelectric layer 303. The electrode lead 501 is connected to the upper electrode layer 304, such that the resonator is provided with a resonance function. The electrode lead 501 is not connected to the first metal shielding wall 413, so as to prevent a short circuit that affects a performance of the resonator. The closed metal shielding structure provides electromagnetic shielding effect. The electrode lead 501 is connected to a signal source, which enables the resonator operates normally.

Second Embodiment

The second embodiment differs from the first embodiment in the step S2, and the other steps are identical in the two embodiments. FIG. 8a to FIG. 8g are schematic structural diagrams of a solidly mounted resonator having an electromagnetic shielding structure during the step S2 according to the second embodiment. As shown in FIG. 9, the step S2 includes following sub-steps S21' to S22'.

In step S21', a lower electrode layer and then an acoustic-wave reflecting layer are fabricated on the piezoelectric layer, and a dielectric layer surrounding the lower electrode layer and the acoustic-wave reflecting layer is simultaneously formed.

In step S22', the dielectric layer is etched to obtain a groove surrounding the lower electrode layer and the acoustic-wave reflecting layer, and then the groove is filled with a metal material to form the first metal shielding wall.

Figure 10:
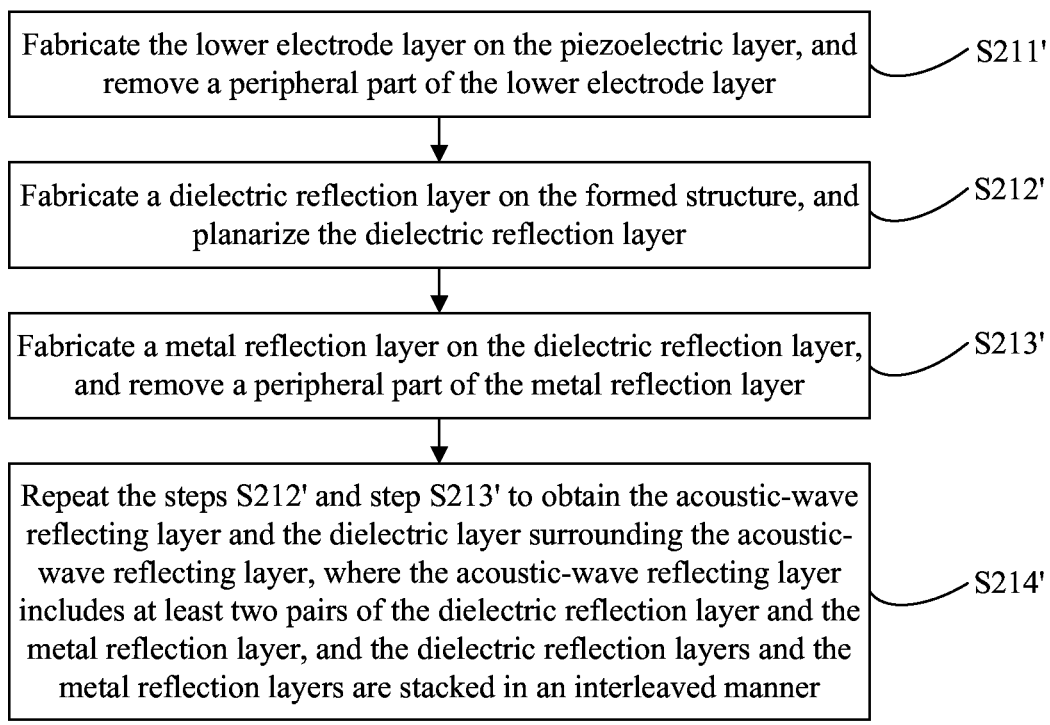
FIG. 10 shows a flowchart of step S21' of a method for manufacturing a solidly mounted resonator having an electromagnetic shielding structure according to a second embodiment of the present disclosure.

Reference is made to FIG. 10. In a specific embodiment, the step S21' includes following sub-steps S211' to S214'.

In step S211', the lower electrode layer is fabricated on the piezoelectric layer, and a peripheral part of the lower electrode layer is removed.

In step S212', a dielectric reflection layer is formed on a structure obtained after the step S211', and the dielectric reflection layer is planarized.

In step S213', a metal reflection layer is formed on the dielectric reflection layer, and a peripheral part of the metal reflection layer is removed.

In step S214', the steps S212' to S213' are repeated to obtain the acoustic-wave reflecting layer and the dielectric layer surrounding the acoustic-wave reflecting layer. The acoustic-wave reflecting layer includes at least two pairs of the dielectric reflection layer and the metal reflection layer, and the dielectric reflection layers and the metal reflection layers are stacked in an interleaved manner.

Figure 8A:
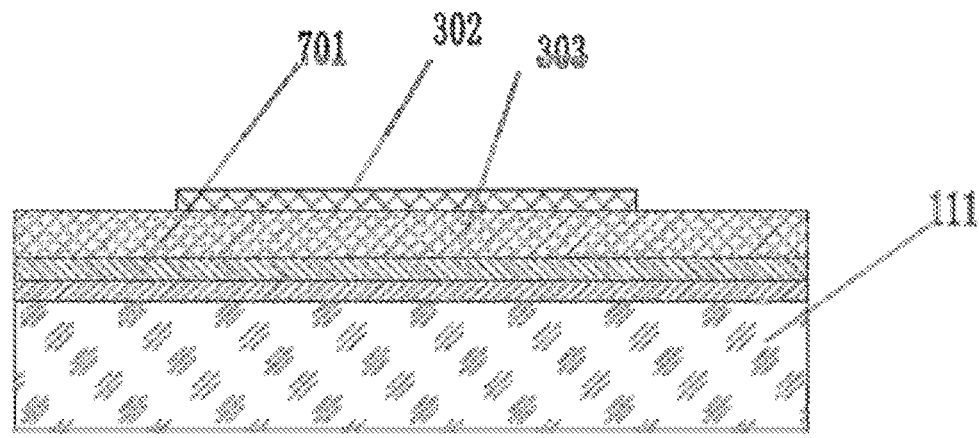
FIG. 8a to FIG. 8h show schematic structural diagrams of a solidly mounted resonator having an electromagnetic shielding structure during a method according to a second embodiment of the present disclosure.
Figure 8B:
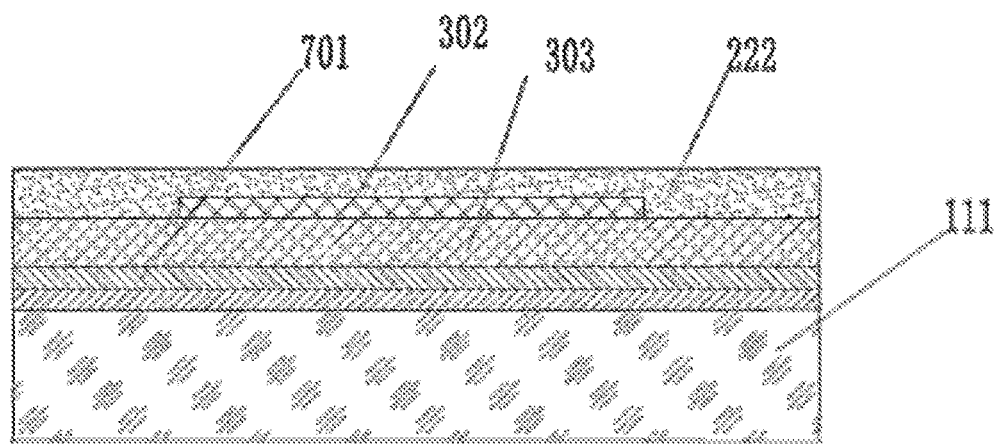
Figure 8C:
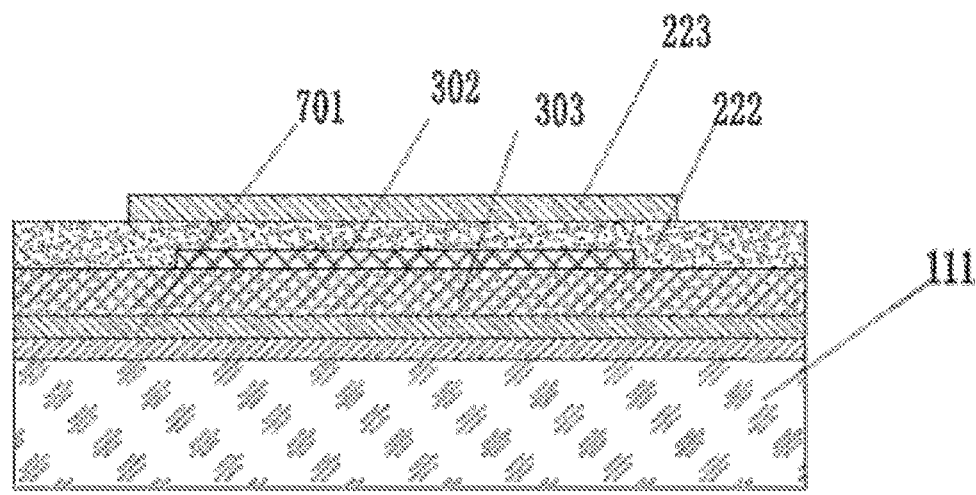
Figure 8D:
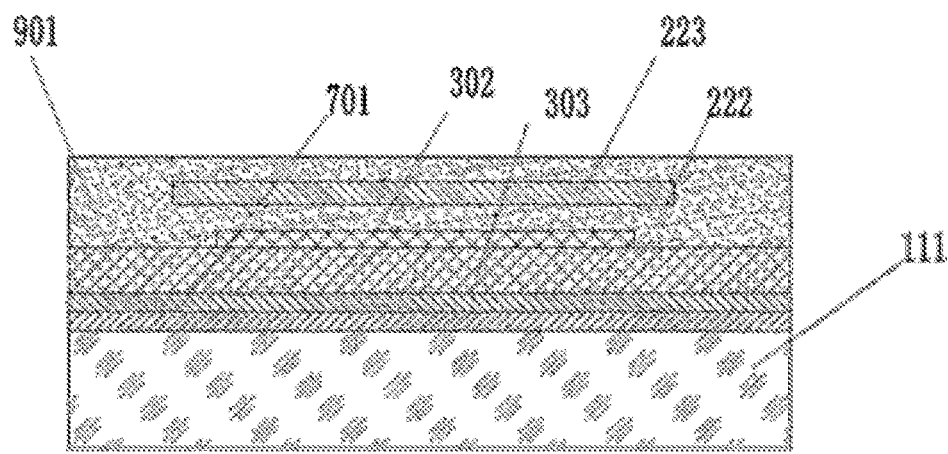
Figure 8E:
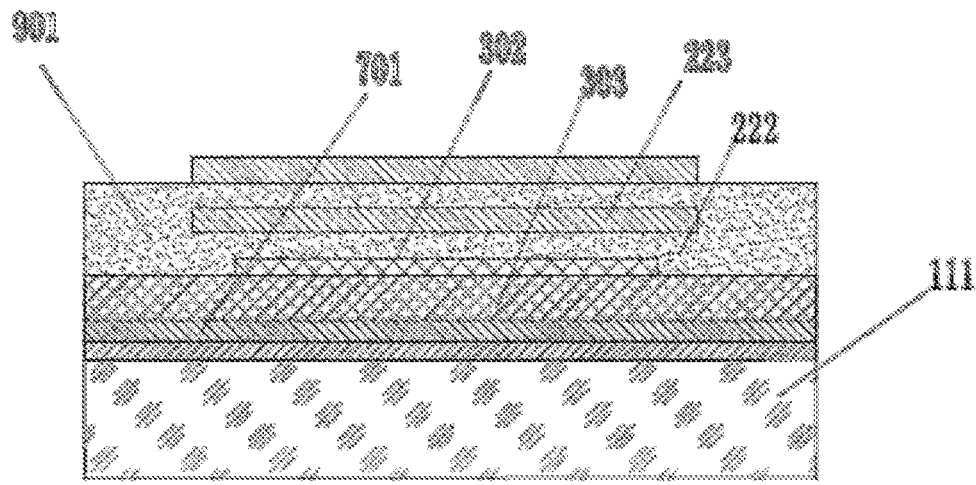
Figure 8F:
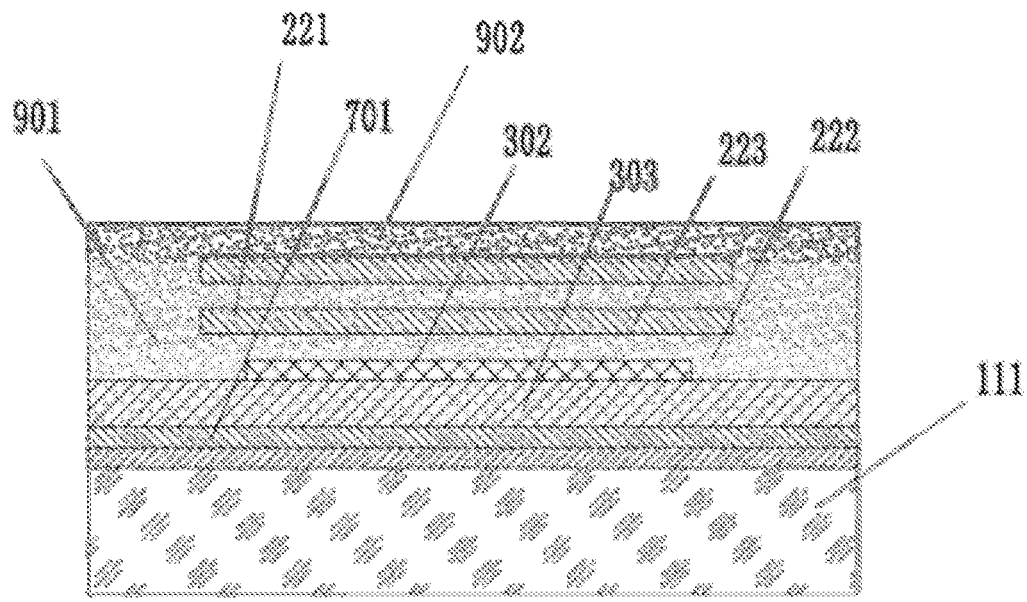
Figure 9:
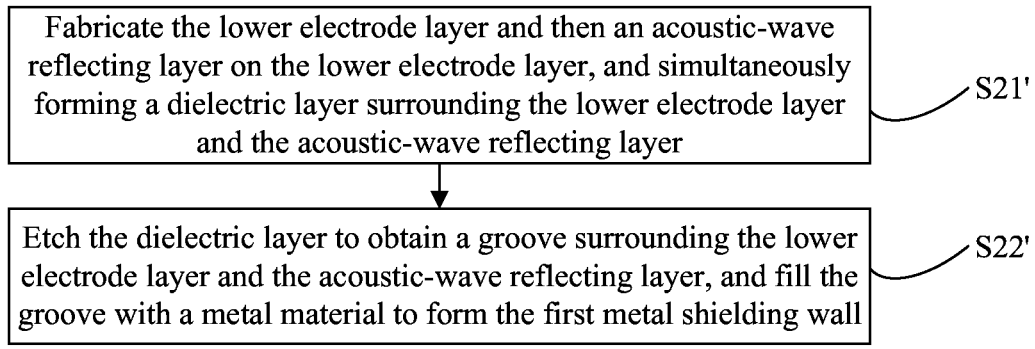
FIG. 9 shows a flowchart of step S2 of a method for manufacturing a solidly mounted resonator having an electromagnetic shielding structure according to a second embodiment of the present disclosure.

Reference is made to FIG. 8a. In a specific embodiment, a lower electrode layer 302 is fabricated on the piezoelectric layer 303 through photolithography, sputtering, and etching. In a preferable embodiment, a material of the lower electrode layer 302 is Mo. Reference is made to FIG. 8b. A dielectric reflection layer 222 is formed through CVD and CMP. In a preferable embodiment, a material of the dielectric reflection layer 222 is $SiO_2$. After the CMP, a thickness of the dielectric reflection layer 222 remaining on the lower electrode layer 302 is ¼ of a longitudinal wavelength λ of the resonator. Reference is made to FIG. 8c. A metal reflection layer 223 is fabricated on the dielectric reflection layer 222 through photolithography, sputtering, and etching. A thickness of the metal reflection layer 223 is ¼ of the longitudinal wavelength λ of the resonator. Steps S212' to S213' are repeated to obtain structures as shown in FIG. 8d and FIG. 8e, in which the acoustic-wave reflecting layer 221 includes multiple pairs of the dielectric reflection layer 222 and the metal reflection layer 223, and the dielectric reflection layers 222 and the metal reflection layers 223 are stacked in an interleaved manner. When being fabricated, the peripheral part of each metal reflection layer 223 is removed. A peripheral part of the acoustic-wave reflecting layer 221 serves as a dielectric layer 901, which is formed by the planarized dielectric reflection layers 222. Hence, the dielectric layer 901 and the acoustic-wave reflecting layer 221 are simultaneously formed in the foregoing process, which simplifies processing. Moreover, a surface of the piezoelectric layer 303 is flat, which ensures uniformity with respect to stress and electromechanical coupling coefficients. Hence, a performance and a product yield of the resonators can be improved.

Figure 11:
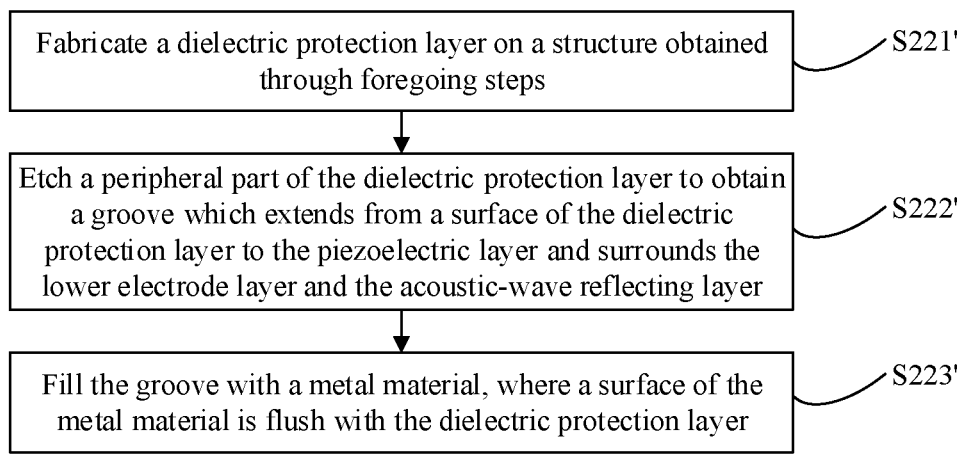
FIG. 11 shows a flowchart of step S22' of a method for manufacturing a solidly mounted resonator having an electromagnetic shielding structure according to a second embodiment of the present disclosure.

Reference is made to FIG. 11. In a specific embodiment, the step S22' includes sub-steps S221' to S223'.

In step S221', a dielectric protection layer is fabricated on a structure obtained through foregoing steps.

In step S222', a peripheral part of the dielectric protection layer is etched to obtain a groove. The groove extends from a surface of the dielectric protection layer to the piezoelectric layer and surrounds the lower electrode layer and the acoustic-wave reflecting layer.

In step S223', the groove is filled with a metal material. A surface of the metal material is flush with the dielectric protection layer.

Figure 8G:
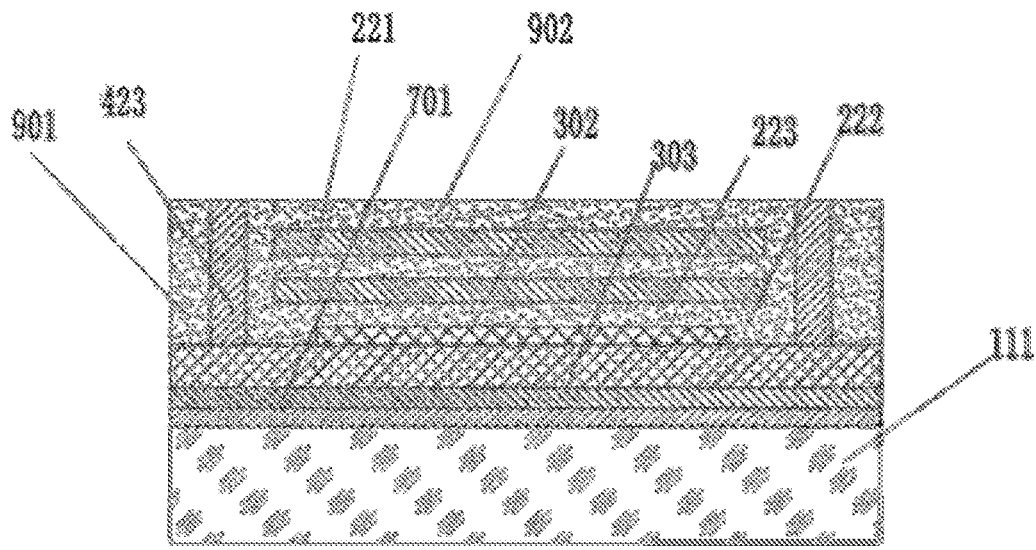
Figure 8H:
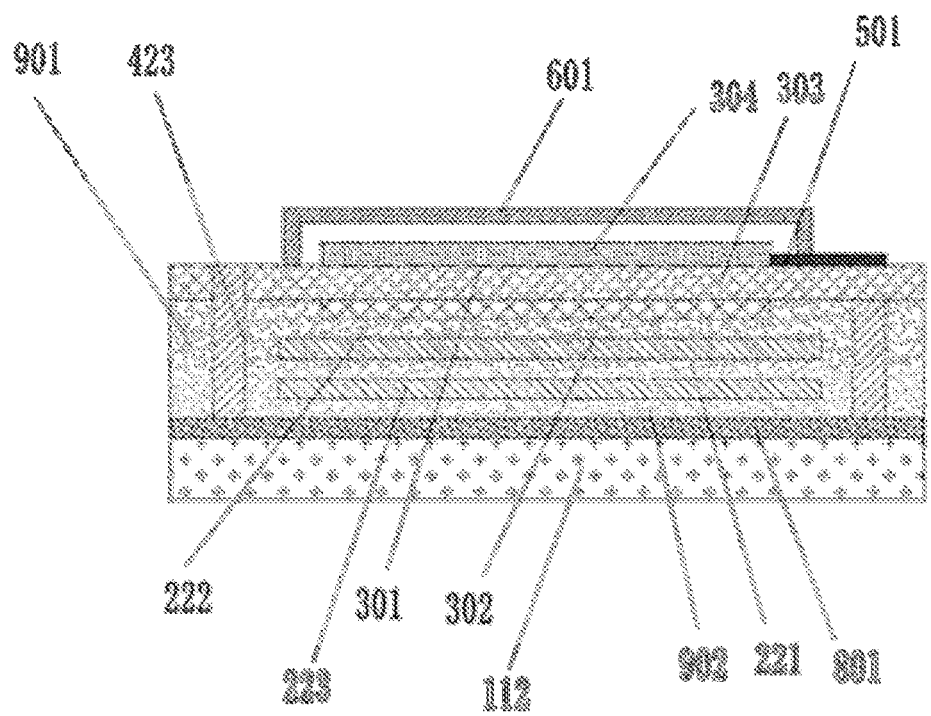

Reference is made to FIG. 83. In a specific embodiment, a dielectric protection layer 902 is formed on the acoustic-wave reflecting layer 221 through CVD and CMP. Reference is made to FIG. 8g. A groove is fabricated at a peripheral part of the dielectric protection layer 902 and in the dielectric layer 901, through photolithography, etching, sputtering (or electroplating, evaporation, etc.) and CMP, and then the groove is filled with a metal material to form the first metal shielding wall 423. The dielectric layer 901 is located below the peripheral part of the dielectric protection layer 902. The first metal shielding wall 423 surrounding the lower electrode layer 302 and the acoustic-wave reflecting layer 221 is formed by processing such as etching and metal filling at the peripheral part of the dielectric protection layer 902. The first metal shielding wall 423 can protect the lower electrode layer 302 and the sound wave reflection layer 221 effectively against electromagnetic interferences from an internal or external signal source. Subsequent processing is same as those described in the first embodiment, and are not repeated herein. The final solidly mounted resonator having the electromagnetic shielding structure is as shown in FIG. 8h.

The solidly mounted resonator having the electromagnetic shielding structure and the method for manufacturing the same are provided according to embodiments of the present disclosure. The solidly mounted resonator includes the substrate, the acoustic-wave reflecting layer formed on the substrate, the resonance function layer formed on the acoustic-wave reflecting layer, and the metal shielding wall formed on the substrate. The metal shielding wall surrounds the effective region in the acoustic-wave reflecting layer and the resonance function layer. Additionally, the closed electromagnetic shielding structure is formed at a periphery of the effective region in the acoustic-wave reflecting layer and the resonance function layer. Thereby, the electromagnetic shielding structure is formed simultaneously with the resonator, and it is not necessary to provide an additional electromagnetic shielding device. Hence, an influence of an external or internal electromagnetic interference source on the resonator is avoided while ensuring a small dimension and a high performance of the resonator. Signal isolation of radio-frequency terminal products is greatly enhanced, and hence noise signals are suppressed, especially for adjacent frequency bands and signal transmitters. In addition, the electromagnetic shielding layer can enhance heat dissipation of operating filters to a certain extent. A surface of the piezoelectric layer obtained through the above solution is flat, which ensures uniformity with respect to stress and electromechanical coupling coefficients. Hence, a performance and a product yield of the resonators can be improved.

Hereinabove described are specific embodiments of the present disclosure. The protection scope of the present disclosure is not limited by the embodiments. Any modification or substitution that can be easily envisaged by those skilled in the art within the technical scope disclosed in the present disclosure shall fall within the protection scope of the present disclosure. Therefore, the protection scope of the present disclosure shall be subject to the protection scope defined in the claims.

It should be understood that in the description of the present disclosure, orientations or positional relationships indicated by the terms "upper", "lower", "inside", "outside", and the like, are based on the drawings. These terms are merely intended for facilitating describing the present disclosure and simplifying the description, rather than indicating or implying that devices or elements defined by the terms must comply with the designated orientation, or must be constructed and operated according to the designated orientation. Therefore, such terms should not be construed as a limitation to the present disclosure. The word "comprising (including)" does not exclude presence of elements or steps not listed in a claim. The article 'a' or 'an' preceding an element does not exclude that there are multiple such elements. The mere fact that certain measures are recited in different dependent claims does not indicate that a combination of these measures cannot be utilized for improvement. Any reference sign in the claims should not be construed as a limitation.

The invention claimed is:

1. A solidly mounted resonator having an electromagnetic shielding structure, comprising:
   a substrate;
   an acoustic-wave reflecting layer formed on the substrate;
   a resonance function layer formed on the acoustic-wave reflecting layer, wherein the resonance function layer comprises a lower electrode layer, a piezoelectric layer, and an upper electrode layer, which are stacked in the above-listed sequence; and
   a metal shielding wall formed on the substrate, wherein the metal shielding wall surrounds an effective region in the acoustic-wave reflecting layer and the resonance function layer;
   wherein the metal shielding wall comprises a first metal shielding wall and a second metal shielding wall which are electrically connected, the first metal shielding wall surrounds the lower electrode layer and the acoustic-wave reflecting layer, and the second metal shielding wall is filled at a position at which the piezoelectric layer is etched.

2. The solidly mounted resonator according to claim 1, wherein:
the acoustic-wave reflecting layer comprises at least two pairs of dielectric reflection layers and metal reflection layers, and the dielectric reflection layers and the metal reflection layers are stacked in an interleaved manner; and
the metal shielding wall is formed by a stack of a plurality of metal rings, wherein each metal ring of the plurality metal rings is disposed in a same level as a corresponding layer of the acoustic-wave reflecting layer and the resonance function layer.

3. The solidly mounted resonator according to claim 2, wherein:
the plurality of metal rings comprises metal rings that are disposed in a same level as the dielectric reflection layers, the metal reflection layers, the lower electrode layer, the piezoelectric layer, respectively.

4. The solidly mounted resonator according to claim 1, wherein:
the metal shielding wall is an integral closed metal wall, and is integrally formed in the acoustic-wave reflecting layer and the lower electrode layer at a periphery of the effective region.

5. The solidly mounted resonator according to claim 1, wherein:
a metal shielding layer is formed between the substrate and the acoustic-wave reflecting layer, and
the metal shielding wall is in contact with and is electrically connected to the metal shielding layer.

6. The solidly mounted resonator according to claim 1, wherein:
an electrode lead connects the upper electrode layer to outside of the solidly mounted resonator; and
the metal shielding wall in a region in which the electrode lead is located does not extend higher than the piezoelectric layer.

7. The solidly mounted resonator according to claim 1, wherein:
an encapsulation structure capping the upper electrode layer is provided at a top of the solidly mounted resonator.

8. A method for manufacturing a solidly mounted resonator having an electromagnetic shielding structure, comprising:
S1, fabricating a piezoelectric layer on a first substrate;
S2, fabricating a lower electrode layer and then an acoustic-wave reflecting layer on the lower electrode layer, and fabricating a first metal shielding wall on a periphery of the lower electrode layer and the acoustic-wave reflecting layer, wherein the first metal shielding wall surrounds an effective region in the lower electrode layer and the acoustic-wave reflecting layer;
S3, bonding a second substrate onto the acoustic-wave reflecting layer;
S4, removing the first substrate to expose a back surface of the piezoelectric layer, wherein the back surface faces away from the lower electrode layer;
S5, etching the piezoelectric layer at a position corresponding to the first metal shielding wall to expose at least a part of the first metal shielding wall;
S6, fabricating a second metal shielding wall which fills a cavity in the piezoelectric layer and is electrically connected to the first metal shielding wall, wherein the cavity is formed by the etching; and
S7, fabricating an upper electrode layer on the back surface of the piezoelectric layer.

9. The method according to claim 8, wherein the step S2 comprises:
S21, fabricating the lower electrode layer on the piezoelectric layer, and simultaneously forming a first metal shielding ring on a periphery of the lower electrode layer, wherein the first metal shielding ring is disposed in a same level as the lower electrode layer and surrounds the lower electrode layer; and
S22, fabricating the acoustic-wave reflecting layer on the lower electrode layer, and simultaneously forming a second metal shielding ring on the first metal shielding ring, wherein the second metal shielding ring is disposed in a same level as the acoustic-wave reflecting layer and surrounds the acoustic-wave reflecting layer, and an integral of the first metal shielding ring and the second metal shielding ring serves as the first metal shielding wall.

10. The method according to claim 9, wherein the step S21 comprises:
fabricating a first metal layer on the piezoelectric layer, and
forming the lower electrode layer and the first metal shielding ring through photolithography and etching, wherein the first shielding ring surrounds the lower electrode layer and is not connected to the lower electrode layer.

11. The method according to claim 9, wherein the step S22 comprises:
S221, growing a dielectric reflection layer on a structure obtained through the steps before the step S22, and planarizing the dielectric reflection layer;
S222, etching the dielectric reflection layer to expose the first metal shielding ring under the dielectric reflection layer, fabricating a second metal layer on the dielectric reflection layer, and planarzing the second metal layer to form another metal shielding ring on the first metal shielding ring, wherein the another metal shielding ring is flush with the dielectric reflection layer;
S223, fabricating a third metal layer on the dielectric reflection layer to form a dual-functional layer, wherein the dual-functional layer comprises a metal reflection layer on the dielectric reflection layer and yet another metal shielding ring surrounding the metal reflection layer; and
S224, repeating the step S221 to the step S223 to obtain the acoustic-wave reflecting layer and the second metal shielding ring surrounding the acoustic-wave reflecting layer, wherein the acoustic-wave reflecting layer comprises at least two pairs of the dielectric reflection layer and the metal reflection layer, and the dielectric reflection layers and the metal reflection layers are stacked in an interleaved manner.

12. The method according to claim 8, wherein the step S2 comprises:
S21', fabricating a lower electrode layer and then an acoustic-wave reflecting layer on the lower electrode layer, and simultaneously forming a dielectric layer surrounding the lower electrode layer and the acoustic-wave reflecting layer; and
S22', etching the dielectric layer to obtain a groove surrounding the lower electrode layer and the acoustic-wave reflecting layer, and filling the groove with a metal material to form the first metal shielding wall.

13. The method according to claim 12, wherein the step S21' comprises:
- S211', fabricating the lower electrode layer on the piezoelectric layer, and removing a peripheral part of the lower electrode layer;
- S212', fabricating a dielectric reflection layer on a structure obtained after the step S211', and planarizing the dielectric reflection layer;
- S213', fabricating a metal reflection layer on the dielectric reflection layer, and removing a peripheral part of the metal reflection layer; and
- S214', repeating the step S212' and the step S213' to form the acoustic-wave reflecting layer and the dielectric layer surrounding the acoustic-wave reflecting layer, wherein the acoustic-wave reflecting layer comprises at least two pairs of the dielectric reflection layer and the metal reflection layer, and the dielectric reflection layers and the metal reflection layers are stacked in an interleaved manner.

14. The method according to claim 12, wherein the step S22' comprises:
- S221', fabricating a dielectric protection layer on a structure obtained through steps before the step S22';
- S222', etching a peripheral part of the dielectric protection layer to obtain another groove which extends from a surface of the dielectric protection layer to the piezoelectric layer and surrounds the lower electrode layer and the acoustic-wave reflecting layer; and
- S223', filling the another groove with the metal material, wherein a surface of the metal material is flush with the dielectric protection layer.

15. The method according to claim 8, wherein before the step S1, the method further comprises forming a seed layer on the first substrate, and
the step S4 comprises:
- removing the first substrate and the seed layer and thinning the piezoelectric layer, through grinding, chemical mechanical polishing, and trimming.

16. The method according to claim 15, wherein the piezoelectric layer is made of AlN, and initial amorphous AlN in the piezoelectric layer is removed during the trimming.

17. The method according to claim 15, wherein the seed layer comprises two or more layers formed through sputtering or deposition.

18. The method according to claim 17, wherein the seed layer comprises one of an AlN layer, a Cr layer, an Jr layer, or a Pt layer, and a Mo layer disposed on a surface of the one of the AlN layer, the Cr layer, the Jr layer, or the Pt layer away from the first substrate.

19. The method according to claim 17, wherein the seed layer comprises a SiC layer and an AlN layer, and the AlN layer is disposed on a surface of the SiC layer away from the first substrate.

20. The method according to claim 8, wherein the step S3 comprises:
- fabricating a metal connection layer on the acoustic-wave reflecting layer;
- forming a metal layer on a surface of the second substrate through evaporation, and
- bonding the surface of the second substrate to the metal connection layer.

* * * * *